(12) United States Patent
Nakashima et al.

(10) Patent No.: US 12,286,500 B2
(45) Date of Patent: Apr. 29, 2025

(54) RESIN COMPOSITION, PREPREG, RESIN-EQUIPPED FILM, RESIN- EQUIPPED METAL FOIL, METAL-CLAD LAMINATE, AND WIRING BOARD

(71) Applicant: PANASONIC INTELLECTUAL PROPERTY MANAGEMENT CO., LTD., Osaka (JP)

(72) Inventors: Taichi Nakashima, Fukushima (JP); Hiroyuki Fujisawa, Fukushima (JP); Akira Otsuka, Fukushima (JP); Koichi Isaji, Fukushima (JP); Hajime Ogushi, Fukushima (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 18/284,386

(22) PCT Filed: Mar. 24, 2022

(86) PCT No.: PCT/JP2022/013786
§ 371 (c)(1),
(2) Date: Sep. 27, 2023

(87) PCT Pub. No.: WO2022/210227
PCT Pub. Date: Oct. 6, 2022

(65) Prior Publication Data
US 2024/0092962 A1 Mar. 21, 2024

(30) Foreign Application Priority Data
Mar. 29, 2021 (JP) .................................. 2021-055868

(51) Int. Cl.
*C08F 290/06* (2006.01)
*C08J 5/24* (2006.01)
(Continued)

(52) U.S. Cl.
CPC ........... *C08F 290/062* (2013.01); *C08J 5/244* (2021.05); *C08J 5/249* (2021.05); *C08K 9/06* (2013.01);
(Continued)

(58) Field of Classification Search
CPC . C08F 290/062; C08F 222/40; C08J 2351/08; C08J 5/249
See application file for complete search history.

(56) References Cited

U.S. PATENT DOCUMENTS 4,888,397 A * 12/1989 van der Meer ....... C08L 71/126
525/391
2021/0032404 A1 2/2021 Shigaki et al.

FOREIGN PATENT DOCUMENTS

JP H06-179734 * 6/1994
JP H06-179734 A 6/1994
(Continued)

OTHER PUBLICATIONS

ISR issued in International Patent Application No. PCT/JP2022/013786, May 17, 2022, translation.

*Primary Examiner* — Mark S Kaucher
(74) *Attorney, Agent, or Firm* — GREENBLUM & BERNSTEIN, P.L.C.

(57) ABSTRACT

A resin composition contains a preliminary reaction product (A) obtained by previously reacting a polyphenylene ether compound (a1) having a hydroxyl group in a molecule and an acid anhydride (a2) having an acid anhydride group in a molecule, and a curable resin (B) containing a reactive compound having an unsaturated double bond in a molecule, in which an equivalent ratio of the acid anhydride group in the acid anhydride (a2) to the hydroxyl group in the polyphenylene ether compound (a1) is 1.5 or less, and a content of the curable resin (B) is 20 to 85 parts by mass with respect
(Continued)

to 100 parts by mass of a sum of the preliminary reaction product (A) and the curable resin (B).

14 Claims, 5 Drawing Sheets

(51) Int. Cl.
*C08K 9/06* (2006.01)
*H05K 1/03* (2006.01)
(52) U.S. Cl.
CPC ........ *H05K 1/0366* (2013.01); *C08J 2351/08* (2013.01)

(56) References Cited

FOREIGN PATENT DOCUMENTS

JP        H07-166049 A     6/1995
WO     2019/138992 A1   7/2019

* cited by examiner

RESIN COMPOSITION, PREPREG, RESIN-EQUIPPED FILM, RESIN- EQUIPPED METAL FOIL, METAL-CLAD LAMINATE, AND WIRING BOARD

TECHNICAL FIELD

The present invention relates to a resin composition, a prepreg, a film with resin, a metal foil with resin, a metal-clad laminate, and a wiring board.

BACKGROUND ART

In various electronic devices, mounting technologies such as higher integration of semiconductor devices to be mounted, higher wiring density, and multi-layering have rapidly progressed along with an increase in the amount of information processed. In addition, wiring boards used in various electronic devices are required to be, for example, high-frequency compatible wiring boards such as a millimeter-wave radar board for in-vehicle use. Substrate materials for forming insulating layers of wiring boards used in various electronic devices are required to have a low dielectric constant and a low dielectric loss tangent in order to increase the signal transmission speed and to decrease the signal transmission loss.

It is known that polyphenylene ether exhibits excellent low dielectric properties such as a low relative dielectric constant and a low dielectric loss tangent and exhibits excellent low dielectric properties such as a low relative dielectric constant and a low dielectric loss tangent in a high frequency band (high frequency region) from the MHz band to the GHz band as well. For this reason, it has been investigated that polyphenylene ether is used, for example, as a high frequency molding material. More specifically, polyphenylene ether is preferably used as a substrate material for forming an insulating layer of a wiring board to be equipped in an electronic device utilizing a high frequency band. Examples of substrate materials containing polyphenylene ether include the resin composition described in Patent Literature 1.

Patent Literature 1 describes a curable resin composition containing a reaction product of polyphenylene ether with an unsaturated carboxylic acid or an acid anhydride, triallyl cyanurate, and a brominated aromatic compound containing at least one imide ring. Patent Literature 1 discloses that a polyphenylene ether-based resin composition that retains the excellent dielectric properties of polyphenylene ether and exhibits excellent flame retardancy, chemical resistance, and heat resistance after curing.

Insulating layers of wiring boards used in various electronic devices are also required to have a property that smears generated by the drilling can be properly removed when drilling is performed using a drill, laser, or the like. Specifically, insulating layers of wiring boards are required to have a property (excellent desmear properties) that smears can be properly removed with permanganic acid or the like while damage to the insulating layers of wiring boards is suppressed. Hence, substrate materials for forming insulating layers of wiring boards are required to afford cured products exhibiting excellent desmear properties.

Wiring boards used in various electronic devices are also required to be hardly affected by changes in the external environment. For example, the wiring boards are required to exhibit excellent heat resistance so as to be used in environments having relatively high temperatures as well. Hence, substrate materials for forming insulating layers of the wiring boards are required to afford cured products exhibiting excellent heat resistance. Substrate materials for forming insulating layers of the wiring boards are required to afford cured products having high glass transition temperatures in order to obtain wiring boards exhibiting excellent reliability in a wide temperature range as well.

CITATION LIST

Patent Literature

Patent Literature 1: JP H7-166049 A

SUMMARY OF INVENTION

The present invention has been made in view of such circumstances, and an object thereof is to provide a resin composition, which affords a cured product exhibiting excellent low dielectric properties, heat resistance, and desmear properties and a high glass transition temperature. Another object of the present invention is to provide a prepreg, a film with resin, a metal foil with resin, a metal-clad laminate, and a wiring board, which are obtained using the resin composition.

An aspect of the present invention is a resin composition containing a preliminary reaction product (A) obtained by previously reacting a polyphenylene ether compound (a1) having a hydroxyl group in a molecule and an acid anhydride (a2) having an acid anhydride group in a molecule, and a curable resin (B) containing a reactive compound having an unsaturated double bond in a molecule, in which an equivalent ratio of the acid anhydride group in the acid anhydride (a2) to the hydroxyl group in the polyphenylene ether compound (a1) is 1.5 or less, and a content of the curable resin (B) is 20 to 85 parts by mass with respect to 100 parts by mass of a sum of the preliminary reaction product (A) and the curable resin (B).

DESCRIPTION OF EMBODIMENTS

Figure 1:
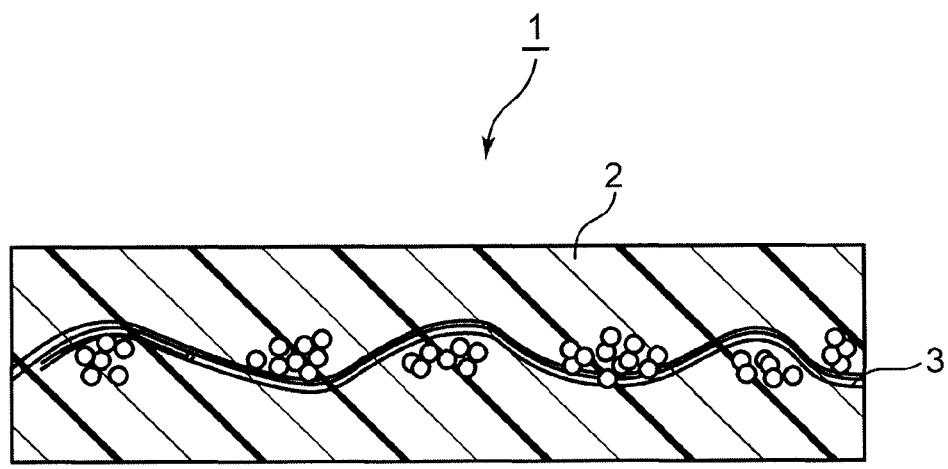
FIG. 1 is a schematic sectional view illustrating an example of a prepreg according to an embodiment of the present invention.

The present inventors have found out that the objects are achieved by the present invention described below as a result of extensive studies.

Hereinafter, embodiments according to the present invention will be described, but the present invention is not limited thereto.

[Resin Composition]

A resin composition according to an embodiment of the present invention contains a preliminary reaction product (A) obtained by previously reacting a polyphenylene ether compound (a1) having a hydroxyl group in the molecule and an acid anhydride (a2) having an acid anhydride group in the molecule, and a curable resin (B) containing a reactive compound having an unsaturated double bond in the molecule. The equivalent ratio of the acid anhydride group in the acid anhydride (a2) to the hydroxyl group in the polyphenylene ether compound (a1) (acid anhydride group in acid anhydride (a2)/hydroxyl group in polyphenylene ether compound (a1)) is 1.5 or less. In other words, the amount of acid anhydride groups in the acid anhydride (a2) is 1.5 equivalents or less when the amount of hydroxyl groups in the polyphenylene ether compound (a1) is set to 1 equivalent. The content of the curable resin (B) is 20 to 85 parts by mass with respect to 100 parts by mass of the sum of the preliminary reaction product (A) and the curable resin (B). By curing the resin composition having such a configuration, a cured product is obtained which exhibits excellent low dielectric properties, heat resistance, and desmear properties and a high glass transition temperature.

By curing the preliminary reaction product (A) obtained by previously reacting the polyphenylene ether compound (a1) and the acid anhydride (a2) together with the curable resin (B), it is considered that the resin composition can be suitably cured, and a cured product is obtained which has a high glass transition temperature and excellent heat resistance while maintaining the excellent low dielectric properties of the polyphenylene ether chain in the polyphenylene ether compound (a1). When the resin composition contains the acid anhydride (a2), it is considered that the obtained cured product is likely to undergo desmear. When the resin composition contains the acid anhydride (a2), it is considered that the glass transition temperature of the obtained cured product also increases. By previously reacting the acid anhydride (a2) with the polyphenylene ether compound (a1) in the resin composition, it is considered that the acid anhydride (a2) is less likely to be volatilized and is likely to be retained in the resin composition. Therefore, it is considered that it is possible to favorably exert the action by the acid anhydride (a2), for example, the action that the obtained cured product is likely to undergo desmear or the glass transition temperature of the obtained cured product increases. Furthermore, the polyphenylene ether compound (a1) and the acid anhydride (a2) are contained so that the equivalent ratio of the acid anhydride group in the acid anhydride (a2) to the hydroxyl group in the polyphenylene ether compound (a1) is in the above range. The preliminary reaction product (A) and the curable resin (B) are contained so that the content of the curable resin (B) is in the above range. By containing the polyphenylene ether compound (a1) and the acid anhydride (a2) as described above, and further by containing the preliminary reaction product (A) and the curable resin (B) as described above, ease of desmear and the like can be suitably adjusted while excellent low dielectric properties are maintained. From these facts, it is considered that the resin composition affords a cured product, which exhibits excellent low dielectric properties, heat resistance, and desmear properties and a high glass transition temperature.

(Preliminary Reaction Product (A))

The preliminary reaction product (A) is not particularly limited as long as it is a preliminary reaction product obtained by previously reacting a polyphenylene ether compound (a1) having a hydroxyl group in the molecule and an acid anhydride (a2) having an acid anhydride group in the molecule. The preliminary reaction product (A) is capable of reacting with the curable resin (B). The resin composition is cured by reacting the preliminary reaction product (A) with the curable resin (B). The resin composition is only required to contain a reaction product obtained by reacting the polyphenylene ether compound (a1) and the acid anhydride (a2) as the preliminary reaction product (A) and may contain the unreacted polyphenylene ether compound (a1) or the unreacted acid anhydride (a2). The resin composition may contain the reaction product as the preliminary reaction product (A), and may further contain the polyphenylene ether compound (a1) and the acid anhydride (a2).

(Polyphenylene Ether Compound (a1))

The polyphenylene ether compound (a1) is not particularly limited as long as it is a polyphenylene ether compound having a hydroxyl group in the molecule. The polyphenylene ether compound (a1) has a polyphenylene ether chain in the molecule and preferably has, for example, a repeating unit represented by the following Formula (1) in the molecule.

[Chem. 1]

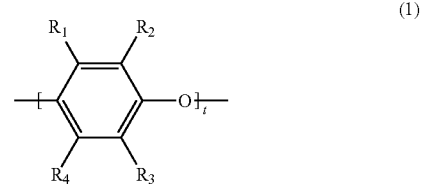

(1)

In Formula (1), t represents 1 to 50. $R_1$ to $R_4$ are independent of each other. In other words, $R_1$ to $R_4$ may be the same group as or different groups from each other. $R_1$ to $R_4$ represent a hydrogen atom, an alkyl group, an alkenyl group, an alkynyl group, a formyl group, an alkylcarbonyl group, an alkenylcarbonyl group, or an alkynylcarbonyl group. Among these, a hydrogen atom and an alkyl group are preferable.

Specific examples of the respective functional groups mentioned in $R_1$ to $R_4$ include the following.

The alkyl group is not particularly limited and is, for example, preferably an alkyl group having 1 to 18 carbon atoms, more preferably an alkyl group having 1 to 10 carbon atoms. Specific examples thereof include a methyl group, an ethyl group, a propyl group, a hexyl group, and a decyl group.

The alkenyl group is not particularly limited and is, for example, preferably an alkenyl group having 2 to 18 carbon atoms, more preferably an alkenyl group having 2 to 10 carbon atoms. Specific examples thereof include a vinyl group, an allyl group, and a 3-butenyl group.

The alkynyl group is not particularly limited and is, for example, preferably an alkynyl group having 2 to 18 carbon atoms, more preferably an alkynyl group having 2 to 10 carbon atoms. Specific examples thereof include an ethynyl group and a prop-2-yn-1-yl group (propargyl group).

The alkylcarbonyl group is not particularly limited as long as it is a carbonyl group substituted with an alkyl group and is, for example, preferably an alkylcarbonyl group having 2 to 18 carbon atoms, more preferably an alkylcarbonyl group having 2 to 10 carbon atoms. Specific examples thereof include an acetyl group, a propionyl group, a butyryl group, an isobutyryl group, a pivaloyl group, a hexanoyl group, an octanoyl group, and a cyclohexylcarbonyl group.

The alkenylcarbonyl group is not particularly limited as long as it is a carbonyl group substituted with an alkenyl group and is, for example, preferably an alkenylcarbonyl group having 3 to 18 carbon atoms, more preferably an alkenylcarbonyl group having 3 to 10 carbon atoms. Specific examples thereof include an acryloyl group, a methacryloyl group, and a crotonoyl group.

The alkynylcarbonyl group is not particularly limited as long as it is a carbonyl group substituted with an alkynyl group and is, for example, preferably an alkynylcarbonyl group having 3 to 18 carbon atoms, more preferably an alkynylcarbonyl group having 3 to 10 carbon atoms. Specific examples thereof include a propioloyl group.

The weight average molecular weight (Mw) and number average molecular weight (Mn) of the polyphenylene ether compound (a1) are not particularly limited, and for example, are preferably 500 to 5,000, more preferably 800 to 4,000, still more preferably 1,000 to 3,000. When the molecular weight is too low, sufficient heat resistance of the cured product tends to be hardly attained. When the molecular weight is too high, there is a tendency that the melt viscosity of the resin composition is high, sufficient fluidity is not attained, and molding defects cannot be sufficiently suppressed. Hence, when the weight average molecular weight of the polyphenylene ether compound is in the above range, excellent heat resistance and moldability of the cured product can be realized. Here, the weight average molecular weight and number average molecular weight may be those measured by general molecular weight measurement methods, and specific examples thereof include values measured by gel permeation chromatography (GPC). In a case where the polyphenylene ether compound has a repeating unit represented by Formula (1) in the molecule, t is preferably a numerical value so that the weight average molecular weight and number average molecular weight of the polyphenylene ether compound is in the above range. Specifically, t is preferably 1 to 50.

The average number of hydroxyl groups (number of hydroxyl groups) in the polyphenylene ether compound (a1) is not particularly limited, and is, for example, preferably 1 to 5, more preferably 1.5 to 3. When the number of hydroxyl groups is too small, it is difficult for the polyphenylene ether compound (a1) to react with the acid anhydride (a2), the reactivity of the preliminary reaction product obtained by reacting the polyphenylene ether compound (a1) with the acid anhydride (a2) with the curable resin (B) decreases, and sufficient heat resistance of the cured product tends to be hardly attained. When the number of hydroxyl groups is too large, the reactivity of the polyphenylene ether compound (a1) with the acid anhydride (a2) is too high, the reactivity of the preliminary reaction product (A) obtained by reacting the polyphenylene ether compound (a1) with the acid anhydride (a2) with the curable resin (B) is too high, and for example, the storage stability of the resin composition may decrease.

The number of hydroxyl groups in the polyphenylene ether compound can be found, for example, from the product standard value of the polyphenylene ether compound used. Specific examples of the number of hydroxyl groups here include a numerical value representing the average value of hydroxyl groups per 1 molecule of all polyphenylene ether compounds present in 1 mole of polyphenylene ether compound.

The intrinsic viscosity of the polyphenylene ether compound (a1) is not particularly limited, and is, for example, preferably 0.03 to 0.12 dl/g, more preferably 0.04 to 0.11 dl/g, still more preferably 0.06 to 0.095 dl/g. When the intrinsic viscosity is too low, the molecular weight tends to be low, and sufficient heat resistance of the cured product tends to be hardly attained. When the intrinsic viscosity is too high, there is a tendency that the viscosity is high, sufficient fluidity is not attained, and molding defects cannot be suppressed. Hence, when the intrinsic viscosity of the polyphenylene ether compound (a1) is in the above range, excellent heat resistance and moldability of the cured product can be realized.

The intrinsic viscosity here can be found from the product standard value of the polyphenylene ether compound (a1) used. The intrinsic viscosity here is an intrinsic viscosity measured in methylene chloride at 25° C. and more specifically is, for example, a value acquired by measuring the intrinsic viscosity of a methylene chloride solution (liquid temperature: 25° C.) at 0.18 g/45 ml using a viscometer. Examples of the viscometer include AVS500 Visco System manufactured by SCHOTT Instruments GmbH.

The polyphenylene ether compound (a1) is not particularly limited, and examples thereof include those containing polyphenylene ether composed of 2,6-dimethylphenol and at least one of a bifunctional phenol and a trifunctional phenol, and polyphenylene ether such as poly(2,6-dimethyl-1,4-phenylene oxide) as a main component. More specific examples of the polyphenylene ether compound (a1) include a polyphenylene ether compound represented by the following Formula (2) and a polyphenylene ether compound represented by the following Formula (3).

[Chem. 2]

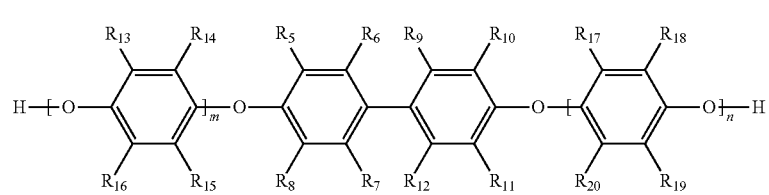

(2)

[Chem. 3]

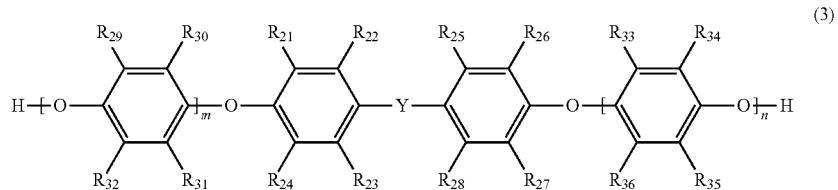

(3)

In Formulas (2) and (3), $R_5$ to $R_{20}$ and $R_{21}$ to $R_{36}$ are independent of each other. In other words, $R_5$ to $R_{20}$ and $R_{21}$ to $R_{36}$ may be the same group as or different groups from each other. Examples of $R_5$ to $R_{20}$ and $R_{21}$ to $R_{36}$ include those the same as $R_1$ to $R_4$ in Formula (1). In other words, $R_5$ to $R_{20}$ and $R_{21}$ to $R_{36}$ represent a hydrogen atom, an alkyl group, an alkenyl group, an alkynyl group, a formyl group, an alkylcarbonyl group, an alkenylcarbonyl group, or an alkynylcarbonyl group. In Formula (3), Y represents a linear, branched, or cyclic hydrocarbon having 20 or less carbon atoms. m and n each preferably represent 0 to 20. In addition, it is preferable that m and n represent numerical values so that the sum of m and n is 1 to 30. Hence, it is more preferable that m represents 0 to 20, n represents 0 to 20, and the sum of m and n represents 1 to 30.

In Formula (3), Y represents a linear, branched, or cyclic hydrocarbon having 20 or less carbon atoms as described above. Examples of Y include a group represented by the following Formula (4).

[Chem. 4]

(4)

In Formula (4), $R_{37}$ and $R_{38}$ each independently represent a hydrogen atom or an alkyl group. Examples of the alkyl group include a methyl group. Examples of the group represented by Formula (4) include a methylene group, a methylmethylene group, and a dimethylmethylene group. Among these, a dimethylmethylene group is preferable.

More specific examples of the polyphenylene ether compound represented by Formula (2) include a polyphenylene ether compound represented by the following Formula (5). More specific examples of the polyphenylene ether compound represented by Formula (3) include a polyphenylene ether compound represented by the following Formula (6).

[Chem. 5]

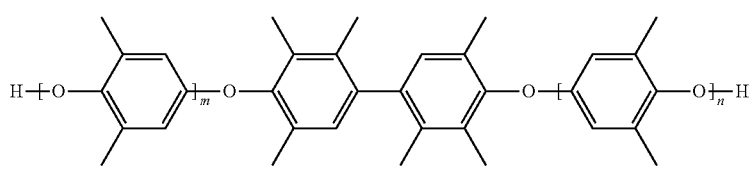

(5)

[Chem. 6]

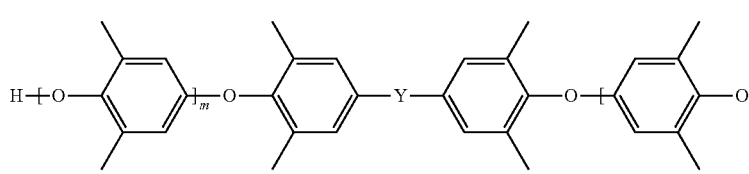

(6)

In Formulas (5) and (6), m and n are the same as m and n in Formulas (2) and (3), and specifically, m and n each preferably represent 0 to 20. In Formula (6), Y is the same as Y in Formula (3).

(Acid Anhydride (a2))

The acid anhydride (a2) is not particularly limited as long as it is an acid anhydride having an acid anhydride group in the molecule. The acid anhydride group may have a structure obtained by dehydration condensation of carboxylic acids in different molecules, or may have a structure obtained by dehydration condensation of two carboxylic acids in the molecule. The acid anhydride (a2) may be an acid anhydride (monofunctional acid anhydride) having one acid anhydride group in the molecule, or may be an acid anhydride (polyfunctional acid anhydride) having two or more acid anhydride groups in the molecule. The acid anhydride (a2) preferably includes an acid anhydride having one or more cyclic acid anhydride groups in the molecule. The number of carbon atoms in the acid anhydride (a2) is not particularly limited, but is preferably 6 or more, more preferably 8 or more and preferably 25 or less, more preferably 18 or less.

The acid anhydride (a2) is not particularly limited, but includes the monofunctional acid anhydride and the polyfunctional acid anhydride as described above.

The monofunctional acid anhydride is not particularly limited, but examples thereof include maleic anhydride, phthalic anhydride, succinic anhydride, trimellitic anhydride, a compound represented by the following Formula (7), methylbicyclo[2.2.1]heptane-2,3-dicarboxylic anhydride, bicyclo[2.2.1]heptane-2,3-dicarboxylic anhydride, nadic anhydride, methylnadic anhydride, hexahydrophthalic anhydride, methylhexahydrophthalic anhydride, 1,2,3,6-tetrahydrophthalic anhydride, tetrapropenyl succinic anhydride (3-dodecenyl succinic anhydride), and octenyl succinic anhydride.

[Chem. 7]

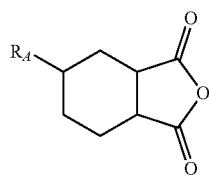

(7)

In Formula (7), $R_A$ represents a hydrogen atom or an alkyl group. The alkyl group is preferably an alkyl group having 1 to 12 carbon atoms, more preferably a methyl group. $R_A$ is also preferably a hydrogen atom. In other words, $R_A$ is preferably a hydrogen atom or a methyl group. The compound represented by Formula (7), where $R_A$ is a methyl group is 4-methylhexahydrophthalic anhydride. The compound represented by Formula (7), where $R_A$ is a hydrogen atom is hexahydrophthalic anhydride.

The polyfunctional acid anhydride is not particularly limited, but examples thereof include 1,2,3,4-butanetetracarboxylic dianhydride, ethylene glycol bisanhydrotrimellitate, glycerin bisanhydrotrimellitate monoacetate, 1,3,3a,4,5,9b-hexahydro-5(tetrahydro-2,5-dioxo-3-furanyl)naphtho[1,2-C]furan-1,3-dione, pyromellitic anhydride, and benzophenonetetracarboxylic anhydride.

A commercial product can be used as the acid anhydride. As succinic anhydride, for example, RIKACID SA manufactured by New Japan Chemical Co., Ltd. can be used. As 4-methylhexahydrophthalic anhydride, for example, RIKACID MH manufactured by New Japan Chemical Co., Ltd. can be used. As the hexahydrophthalic anhydride, for example, RIKACID HH manufactured by New Japan Chemical Co., Ltd. can be used. As 1,2,3,6-tetrahydrophthalic anhydride, for example, RIKACID TH manufactured by New Japan Chemical Co., Ltd. can be used. As tetrapropenyl succinic anhydride (3-dodecenyl succinic anhydride), for example, RIKACID DDSA manufactured by New Japan Chemical Co., Ltd. can be used. As octenyl succinic anhydride, for example, RIKACID OSA manufactured by New Japan Chemical Co., Ltd. can be used. As a mixture of methylbicyclo[2.2.1]heptane-2,3-dicarboxylic anhydride and bicyclo[2.2.1]heptane-2,3-dicarboxylic anhydride, for example, RIKACID HNA-100 manufactured by New Japan Chemical Co., Ltd. can be used. As a mixture of 4-methylhexahydrophthalic anhydride and hexahydrophthalic anhydride (mass ratio 70:30), for example, RIKACID MH-700 manufactured by New Japan Chemical Co., Ltd. can be used. As 1,2,3,4-butanetetracarboxylic dianhydride, for example, RIKACID BT-100 manufactured by New Japan Chemical Co., Ltd. can be used. As ethylene glycol bisanhydro trimellitate, for example, RIKACID TMEG-100, RIKACID TMEG-500, RIKACID TMEG-600, and RIKACID TMEG-S manufactured by New Japan Chemical Co., Ltd. can be used. As glycerin bisanhydro trimellitate monoacetate, for example, RIKACID TMTA-C manufactured by New Japan Chemical Co., Ltd. can be used. As 1,3,3a,4,5,9b-hexahydro-5(tetrahydro-2,5-dioxo-3-furanyl)naphtho[1,2-C]furan-1,3-dione, for example, RIKACID TDA-100 manufactured by New Japan Chemical Co., Ltd. can be used.

The acid anhydride (a2) may be used singly or in combination of two or more kinds thereof.

(Catalyst)

A catalyst may be used in the reaction. The catalyst is not particularly limited as long as it contributes to the progress of the reaction between the polyphenylene ether compound (a1) and the acid anhydride (a2), and examples thereof include 2-ethyl-4-methylimidazole (2E4MZ).

(Reaction Product)

The resin composition may contain a reaction product obtained by reacting the polyphenylene ether compound (a1) with the acid anhydride (a2) as the preliminary reaction product (A). In this reaction, the hydroxyl group in the polyphenylene ether compound (a1) may act on the acid anhydride group in the acid anhydride (a2) to open the ring of the acid anhydride group and form an ester bond. In other words, the reaction product has an ester bond in the molecule. In this reaction, a carboxyl group is generated by ring opening of the acid anhydride group. From these facts, when the reaction proceeds suitably, an ester/carboxyl-modified polyphenylene ether compound having an ester bond and a carboxyl group in the molecule is obtained. Hence, the preliminary reaction product (A) preferably includes an ester/carboxyl-modified polyphenylene ether compound having a terminal modified with a substituent having one or more ester bonds and carboxyl groups.

The reaction product is not particularly limited as long as it is a reaction product obtained by reacting the polyphenylene ether compound (a1) with the acid anhydride (a2), and examples thereof include a compound obtained by reacting the polyphenylene ether compound (a1) with a compound represented by Formula (7) as the acid anhydride (a2) and a compound obtained by reacting the polyphenylene ether compound (a1) with octenyl succinic anhydride as the acid anhydride (a2). Examples of the compound obtained by reacting the polyphenylene ether compound (a1) with a compound represented by Formula (7) as the acid anhydride (a2) include a compound represented by the following Formula (8) although the compound varies depending on the structure of the polyphenylene ether compound (a1), and the like.

[Chem. 8]

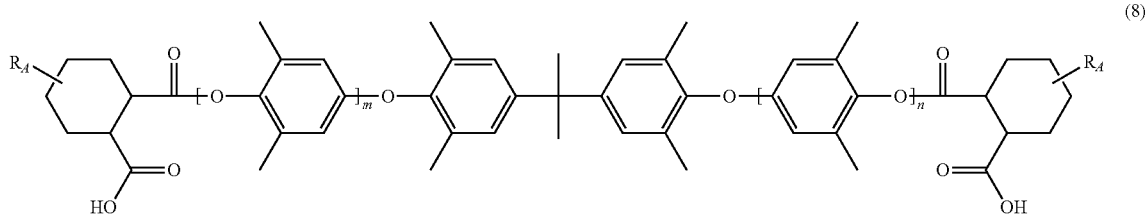

(8)

In Formula (8), $R_A$ includes those the same as $R_A$ in Formula (7), and specifically represents a hydrogen atom or an alkyl group. m and n are the same as m and n in Formulas (2) and (3), and specifically, m and n each preferably represent 0 to 20.

The equivalent ratio of the acid anhydride group in the acid anhydride (a2) to the hydroxyl group in the polyphenylene ether compound (a1) (acid anhydride group in acid anhydride (a2)/hydroxyl group in polyphenylene ether compound (a1)) is 1.5 or less, preferably 0.3 to 1.5, more preferably 0.8 to 1. In other words, the amount of acid anhydride groups in the acid anhydride (a2) is 1.5 equivalents or less, preferably 0.3 to 1.5 equivalents, more preferably 0.8 to 1 equivalent when the amount of hydroxyl groups in the polyphenylene ether compound (a1) is set to 1 equivalent. A too large amount of polyphenylene ether compound (a1) remains when the amount of polyphenylene ether compound (a1) is too large, and a too large amount of acid anhydride (a2) remains when the amount of acid anhydride (a2) is too large, and it tends to be difficult to obtain a suitable preliminary reaction product. Hence, by blending the polyphenylene ether compound (a1) and the acid anhydride (a2) in the above range of equivalent ratio, a suitable preliminary reaction product can be obtained and a resin composition having excellent performance and a cured product thereof can be obtained. The equivalent is a relative value based on the reactive functional group, and the equivalent of hydroxyl groups in the polyphenylene ether compound can also be defined as the phenol equivalent.

Conditions for the reaction are not particularly limited as long as the reaction proceeds. As the conditions for the reaction, for example, conditions under which the ring opening rate of acid anhydride (a2) is 80% to 100% are preferable. In the preliminary reaction, the ring of acid anhydride (a2) is opened by the reaction with the polyphenylene ether compound (a1) as described above. For this reason, the degree of progress of the reaction can be confirmed by the ring opening rate of acid anhydride (a2). In the preliminary reaction product, the ring opening rate of acid anhydride (a2) is preferably 80% to 100% as described above. This decreases the amount of acid anhydride (a2) remaining in the preliminary reaction product (A) and can diminish adverse effects of the acid anhydride (a2). When the ring opening rate of acid anhydride (a2) is too low, a large amount of unreacted acid anhydride (a2) remains, and the acid anhydride (a2) is likely to volatilize and disappear during the fabrication of prepreg. As a result, the curing component is insufficient, and the degree of crosslinking of a cured product of the resin composition is considered to decrease, and the glass transition temperature of the cured product tends to decrease.

The ring opening rate of acid anhydride (a2) can be calculated, for example, by comparing the infrared absorption spectra of the mixtures before and after the reaction. The mixture may have a peak attributed to a cyclic acid anhydride group at near 1800 to 1900 $cm^{-1}$ before and after the reaction (preliminary reaction). The mixture may have a peak attributed to a benzene ring not involved in the reaction at near 1450 to 1580 $cm^{-1}$. Then, using the peak attributed to the benzene ring as an internal standard, the amounts (relative values) of the peaks attributed to the acid anhydride group before and after the reaction are determined. The amount of a peak is determined by the area ratio using the internal standard. Specifically, the area ($A_1$) of a peak attributed to the acid anhydride group before the reaction, the area ($A_2$) of a peak attributed to the acid anhydride group after the reaction, the area ($B_1$) of a peak attributed to the benzene ring before the reaction, and the area ($B_2$) of a peak attributed to the benzene ring after the reaction are used. Thereupon, the area ratio ($A_1/B_1$) is the amount of acid anhydride group before the reaction, and the area ratio ($A_2/B_2$) is the amount of acid anhydride group after the reaction. These are substituted into the following equation.

Ring opening rate (%)=$\{1-(A_2/B_2)/(A_1/B_1)\} \times 100$

The ring opening rate of acid anhydride can be thus determined.

Since the ring opening rate of acid anhydride (a2) changes depending on the heating temperature and heating time during the preparation of varnish, the heating conditions can be appropriately adjusted so that the ring opening rate is 80% or more. The conditions for this preliminary reaction can be appropriately set by sampling the reaction product over time while performing the preliminary reaction and confirming the ring opening rate.

The conditions for the reaction include the conditions described above, and more specifically, the reaction temperature is preferably 30° C. to 100° C., more preferably 60° C. to 80° C. When the reaction temperature is too low, the reaction tends to hardly proceed. When the reaction temperature is too high, the acid anhydride (a2) may volatilize before the acid anhydride (a2) reacts with the polyphenylene ether compound (a1). Hence, when the reaction temperature is in the above range, the polyphenylene ether compound (a1) can be suitably reacted with the acid anhydride (a2). The reaction time is preferably 2 to 10 hours, more preferably 3 to 6 hours. When the reaction time is in the above range, the polyphenylene ether compound (a1) can be suitably reacted with the acid anhydride (a2).

(Curable Resin (B))

The curable resin (B) is not particularly limited as long as it is a curable resin (B) containing a reactive compound having an unsaturated double bond in the molecule. The reactive compound is not particularly limited as long as it is a reactive compound having an unsaturated double bond in the molecule. Examples of the reactive compound include a maleimide compound (B1), and also include a reactive compound (B2) other than the maleimide compound (B1). In other words, the curable resin (B) may contain only a maleimide compound (B1), only a reactive compound (B2) other than the maleimide compound (B1), or both the maleimide compound (B1) and the reactive compound (B2). Among these, the curable resin (B) preferably contains both the maleimide compound (B1) and the reactive compound (B2). In a case where both the maleimide compound (B1) and the reactive compound (B2) are contained, the content of the maleimide compound (B1) is preferably 10 to 70 parts by mass, more preferably 40 to 60 parts by mass with respect to 100 parts by mass of the sum of the preliminary reaction product (A) and the curable resin (B). The content of the reactive compound (B2) is preferably 10 to 70 parts by mass, more preferably 10 to 30 parts by mass with respect to 100 parts by mass of the sum of the preliminary reaction product (A) and the curable resin (B). When the amount of maleimide compound (B1) is too small, there is a tendency that the effect acquired by containing the maleimide compound (B1) cannot be sufficiently exerted. When the amount of reactive compound (B2) is too small, there is a tendency that the effect acquired by containing the reactive compound (B2) cannot be sufficiently exerted. When the amount of maleimide compound (B1) is too large, the amount of reactive compound (B2) tends to be too small, and in this case, there is a tendency that the effect acquired by containing the reactive compound (B2) cannot be sufficiently exerted. When the amount of reactive compound (B2) is too large, the amount of maleimide compound (B1) tends to be too small, and in this case, there is a tendency that the effect acquired by containing the maleimide compound (B1) cannot be sufficiently exerted. The curable resin (B) is a curable compound that becomes a resin by curing the resin composition, and the curable resin (B) itself may have a low molecular weight or a high molecular weight. The curable resin (B) may be used singly or in combination of two or more kinds thereof.

(Maleimide Compound (B1))

The maleimide compound (B1) is not particularly limited as long as it is a compound having a maleimide group in the molecule. Examples of the maleimide compound (B1) include a monofunctional maleimide compound having one maleimide group in the molecule, a polyfunctional maleimide compound having two or more maleimide groups in the molecule, and a modified maleimide compound. Examples of the modified maleimide compound include a modified maleimide compound in which a part of the molecule is modified with an amine compound, a modified maleimide compound in which a part of the molecule is modified with a silicone compound, and a modified maleimide compound in which a part of the molecule is modified with an amine compound and a silicone compound.

Examples of the maleimide compound (B1) include maleimide compounds having a phenylmaleimide group in the molecule, and more specific examples thereof include 4,4'-diphenylmethanebismaleimide, polyphenylmethanemaleimide, m-phenylenebismaleimide, bisphenol A diphenyl ether bismaleimide, 3,3'-dimethyl-5,5'-diethyl-4,4'-diphenylmethane bismaleimide, 4-methyl-1,3-phenylenebismaleimide, 1,6'-bismaleimide-(2,2,4-trimethyl)hexane, biphenylaralkyl-type maleimide resin, and a maleimide compound having a phenylmaleimide group and an arylene structure substituted at the meta position in the molecule.

A commercial product can be used as the malcimide compound (B1). Specifically, as 4,4'-diphenylmethanebismaleimide, for example, BMI-1000 manufactured by Daiwa Kasei Industry Co., Ltd.) can be used. As polyphenylmethane maleimide, for example, BMI-2300 manufactured by Daiwa Kasei Industry Co., Ltd. can be used. As m-phenylenebismaleimide, for example, BMI-3000 manufactured by Daiwa Kasei Industry Co., Ltd. can be used. As bisphenol A diphenyl ether bismaleimide, for example, BMI-4000 manufactured by Daiwa Kasei Industry Co., Ltd. can be used. As 3,3'-dimethyl-5,5'-diethyl-4,4'-diphenylmethanebismaleimide, for example, BMI-5100 manufactured by Daiwa Kasei Industry Co., Ltd. can be used. As 4-methyl-1,3-phenylenebismaleimide, for example, BMI-7000 manufactured by Daiwa Kasei Industry Co., Ltd. can be used. As 1,6'-bismaleimide-(2,2,4-trimethyl)hexane, for example, BMI-TMH manufactured by Daiwa Kasei Industry Co., Ltd. can be used. As the biphenylaralkyl-type maleimide compound, for example, MIR-3000-70T manufactured by Nippon Kayaku Co., Ltd. can be used.

The maleimide compound (B1) may be used singly or in combination of two or more kinds thereof.

(Reactive Compound (132))

The reactive compound (B2) is not particularly limited as long as it is a reactive compound other than the maleimide compound (B1). Examples of the reactive compound (B2) include an unsaturated double bond-modified polyphenylene ether compound having a terminal modified with a substituent having an unsaturated double bond, an allyl compound, an acrylate compound, a methacrylate compound, and vinyl compounds such as a polybutadiene compound and a styrene compound.

The unsaturated double bond-modified polyphenylene ether compound is not particularly limited as long as it is a modified polyphenylene ether compound having a terminal modified with a substituent having an unsaturated double bond. Examples of the unsaturated double bond-modified polyphenylene ether compound include those obtained by modifying a terminal of the polyphenylene ether compound (a1) with a substituent having an unsaturated double bond, and more specific examples thereof include a polyphenylene ether compound (styrene-modified polyphenylene ether) having a vinylbenzyl group (ethenylbenzyl group) at the molecular terminal, a polyphenylene ether compound (acryl-modified polyphenylene ether) having an acryloyl group at the molecular terminal, and a polyphenylene ether compound (methacryl-modified polyphenylene ether) having a methacryloyl group at the molecular terminal.

The allyl compound is a compound having an allyl group in the molecule, and examples thereof include a triallyl isocyanurate compound such as triallyl isocyanurate (TAIC), a diallyl bisphenol compound, and diallyl phthalate (DAP).

The acrylate compound is a compound having an acryloyl group in the molecule, and examples thereof include a monofunctional acrylate compound having one acryloyl group in the molecule and a polyfunctional acrylate compound having two or more acryloyl groups in the molecule. Examples of the monofunctional acrylate compound include methyl acrylate, ethyl acrylate, propyl acrylate, and butyl acrylate. Examples of the polyfunctional acrylate compound include diacrylate compounds such as tricyclodecanedimethanol diacrylate.

The methacrylate compound is a compound having a methacryloyl group in the molecule, and examples thereof include a monofunctional methacrylate compound having one methacryloyl group in the molecule and a polyfunctional methacrylate compound having two or more methacryloyl groups in the molecule. Examples of the monofunctional methacrylate compound include methyl methacrylate, ethyl methacrylate, propyl methacrylate, and butyl methacrylate. Examples of the polyfunctional methacrylate compound include dimethacrylate compounds such as tricyclodecanedimethanol dimethacrylate (DCP).

The vinyl compound is a compound having a vinyl group in the molecule. Examples of the vinyl compound include a monofunctional vinyl compound (monovinyl compound) having one vinyl group in the molecule and a polyfunctional vinyl compound having two or more vinyl groups in the molecule. Examples of the monofunctional vinyl compound include a styrene compound. Examples of the polyfunctional vinyl compound include a polyfunctional aromatic vinyl compound and a vinyl hydrocarbon-based compound. Examples of the vinyl hydrocarbon-based compound include divinylbenzene and a polybutadiene compound.

As the reactive compound (B2), the unsaturated double bond-modified polyphenylene ether compound, an allyl compound, an acrylate compound, a methacrylate compound, a polybutadiene compound, and a styrene compound are preferable among these. The reactive compound (B2) may be used singly or in combination of two or more kinds thereof. In other words, the reactive compound (B2) preferably includes at least one selected from the group consisting of an unsaturated double bond-modified polyphenylene ether compound having a terminal modified with a substituent having an unsaturated double bond, an allyl compound, an acrylate compound, a methacrylate compound, a polybutadiene compound, and a styrene compound.

(Another Curable Resin)

The curable resin (B) may include a curable resin (another curable resin) other than the maleimide compound (B1) and the reactive compound (B2). The other curable resin is not particularly limited, but examples thereof include a benzoxazine compound, an acenaphthylene compound, a cyanate ester compound, and an active ester compound. Among these, the other curable resin is preferably a benzoxazine compound. In other words, it is preferable that the curable resin (B) contains at least one selected from the maleimide compound (B1) or the reactive compound (B2), and further contains a benzoxazine compound. In a case where the other curable resin is included, the content thereof is preferably 5 to 20 by mass with respect to 100 parts by mass of the sum of the preliminary reaction product (A) and the curable resin (B).

The benzoxazine compound is a compound having a benzoxazine ring in the molecule, and examples thereof include a benzoxazine resin. Examples of the benzoxazine compound include a benzoxazine compound (phenolphthalein-type benzoxazine compound) having a phenolphthalein structure in the molecule, a bisphenol F-type benzoxazine compound, and a diaminodiphenylmethane (DDM)-type benzoxazine compound. More specific examples of the benzoxazine compound include 3,3'-(methylene-1,4-diphenylene)bis(3,4-dihydro-2H-1,3-benzoxazine) (P-d type benzoxazine compound) and a 2,2-bis(3,4-dihydro-2H-3-phenyl-1,3-benzoxazine)methane (F-a type benzoxazine compound).

The acenaphthylene compound is a compound having an acenaphthylene structure in the molecule. Examples of the acenaphthylene compound include acenaphthylene, alkylacenaphthylenes, halogenated acenaphthylenes, and phenylacenaphthylenes. Examples of the alkylacenaphthylenes include 1-methyl acenaphthylene, 3-methyl acenaphthylene, 4-methyl acenaphthylene, 5-methyl acenaphthylene, 1-ethyl acenaphthylene, 3-ethyl acenaphthylene, 4-ethyl acenaphthylene, and 5-ethyl acenaphthylene. Examples of the halogenated acenaphthylenes include 1-chloroacenaphthylene, 3-chloroacenaphthylene, 4-chloroacenaphthylene, 5-chloroacenaphthylene, 1-bromoacenaphthylene, 3-bromoacenaphthylene, 4-bromoacenaphthylene, and 5-bromoacenaphthylene. Examples of the phenylacenaphthylenes include 1-phenylacenaphthylene, 3-phenylacenaphthylene, 4-phenylacenaphthylene, and 5-phenylacenaphthylene. The acenaphthylene compound may be a monofunctional acenaphthylene compound having one acenaphthylene structure in the molecule as described above or may be a polyfunctional acenaphthylene compound having two or more acenaphthylene structures in the molecule.

The cyanate ester compound is a compound having a cyanato group in the molecule, and examples thereof include 2,2-bis(4-cyanatophenyl)propane, bis(3,5-dimethyl-4-cyanatophenyl)methane, and 2,2-bis(4-cyanatophenyl)ethane.

The active ester compound is a compound having an ester group exhibiting high reaction activity in the molecule, and examples thereof include a benzenecarboxylic acid active ester, a benzenedicarboxylic acid active ester, a benzenetricarboxylic acid active ester, a benzenetetracarboxylic acid active ester, a naphthalenecarboxylic acid active ester, a naphthalenedicarboxylic acid active ester, a naphthalenctricarboxylic acid active ester, a naphthalenetetracarboxylic acid active ester, a fluorenecarboxylic acid active ester, a fluorenedicarboxylic acid active ester, a fluorenetricarboxylic acid active ester, and a fluorenetetracarboxylic acid active ester.

The other curable resin may be used singly or in combination of two or more kinds thereof.

(Content)

The content of the preliminary reaction product (A) is not particularly limited, but is 15 to 80 parts by mass, preferably 20 to 80 parts by mass, more preferably 30 to 50 parts by mass with respect to 100 parts by mass of the sum of the preliminary reaction product (A) and the curable resin (B). In other words, the content of the curable resin (B) is not particularly limited, but is 20 to 85 parts by mass, preferably 20 to 80 parts by mass, more preferably 50 to 70 parts by mass with respect to 100 parts by mass of the sum of the preliminary reaction product (A) and the curable resin (B). When the amount of preliminary reaction product (A) is too small, that is, the amount of curable resin (B) is too large, there is a tendency that the relative dielectric constant increases and it is difficult to maintain excellent low dielectric properties or it is difficult to perform desmear. When the amount of the curable resin (B) is too small, that is, the amount of the preliminary reaction product (A) is too large, there is a tendency that it is too easy to perform desmear. Hence, when the content of each of the preliminary reaction product (A) and the curable resin (B) is in the above range, it is possible to suitably adjust the ease of desmear and the like while maintaining excellent low dielectric properties.

(Inorganic Filler)

The resin composition may contain an inorganic filler or may not contain an inorganic filler, but preferably contains an inorganic filler. The inorganic filler is not particularly limited as long as it is an inorganic filler that can be used as an inorganic filler contained in a resin composition. Examples of the inorganic filler include metal oxides such as silica, alumina, titanium oxide, magnesium oxide and mica, metal hydroxides such as magnesium hydroxide and aluminum hydroxide, talc, aluminum borate, barium sulfate, aluminum nitride, boron nitride, barium titanate, magnesium carbonate such as anhydrous magnesium carbonate, and calcium carbonate. Among these, silica, metal hydroxides such as magnesium hydroxide and aluminum hydroxide, aluminum oxide, boron nitride, and barium titanate are preferable, and silica is more preferable. The silica is not particularly limited, and examples thereof include crushed silica, spherical silica, and silica particles.

The inorganic filler may be an inorganic filler subjected to a surface treatment or an inorganic filler not subjected to a surface treatment. Examples of the surface treatment include treatment with a silane coupling agent.

Examples of the silane coupling agent include a silane coupling agent having at least one functional group selected from the group consisting of a vinyl group, a styryl group, a methacryloyl group, an acryloyl group, a phenylamino group, an isocyanurate group, a ureido group, a mercapto group, an isocyanate group, an epoxy group, and an acid anhydride group. In other words, examples of this silane coupling agent include compounds having at least one of a vinyl group, a styryl group, a methacryloyl group, an acryloyl group, a phenylamino group, an isocyanurate group, a ureido group, a mercapto group, an isocyanate group, an epoxy group, or an acid anhydride group as a reactive functional group, and further a hydrolyzable group such as a methoxy group or an ethoxy group.

Examples of the silane coupling agent include vinyltriethoxysilane and vinyltrimethoxysilane as those having a vinyl group. Examples of the silane coupling agent include p-styryltrimethoxysilane and p-styryltriethoxysilane as those having a styryl group. Examples of the silane coupling agent include 3-methacryloxypropyltrimethoxysilane, 3-methacryloxypropylmethyldimethoxysilane, 3-methacryloxypropyltriethoxysilane, 3-methacryloxypropylmethyldiethoxysilane, and 3-methacryloxypropylethyldiethoxysilane as those having a methacryloyl group. Examples of the silane coupling agent include 3-acryloxypropyltrimethoxysilane and 3-acryloxypropyltriethoxysilane as those having an acryloyl group. Examples of the silane coupling agent include N-phenyl-3-aminopropyltrimethoxysilane and N-phenyl-3-aminopropyltriethoxysilane as those having a phenylamino group.

The average particle size of the inorganic filler is not particularly limited, and is preferably 0.05 to 10 μm, more preferably 0.1 to 8 μm. Here, the average particle size refers to the volume average particle size. The volume average particle size can be measured by, for example, a laser diffraction method and the like.

The resin composition may contain an inorganic filler as described above. In a case where the resin composition contains the inorganic filler, the content of the inorganic filler is preferably 10 to 250 parts by mass, more preferably 40 to 200 parts by mass with respect to 100 parts by mass of the total mass of the preliminary reaction product (A) and the curable resin (B).

(Other Components)

The resin composition according to the present embodiment may contain components (other components) other than the preliminary reaction product (A) and the curable resin (B), if necessary, as long as the effects of the present invention are not impaired. As the other components contained in the resin composition according to the present embodiment, for example, additives such as a reaction initiator, a curing accelerator, a catalyst, a polymerization retarder, a polymerization inhibitor, a dispersant, a leveling agent, a silane coupling agent, an antifoaming agent, an antioxidant, a heat stabilizer, an antistatic agent, an ultraviolet absorber, a dye or a pigment, and a lubricant may be further contained in addition to an inorganic filler as described above.

As described above, the resin composition according to the present embodiment may contain a reaction initiator. The curing reaction can proceed even though the resin composition does not contain a reaction initiator. However, a reaction initiator may be added since there is a case where it is difficult to raise the temperature until curing proceeds depending on the process conditions. The reaction initiator is not particularly limited as long as it can promote the curing reaction of the resin composition, and examples thereof include a peroxide and an organic azo compound. Examples of the peroxide include dicumyl peroxide, $\alpha,\alpha'$-bis(t-butylperoxy-m-isopropyl)benzene, 2,5-dimethyl-2,5-di(t-butylperoxy)-3-hexyne, and benzoyl peroxide. Examples of the organic azo compound include azobisisobutyronitrile. A metal carboxylate can be concurrently used if necessary. By doing so, the curing reaction can be further promoted. Among these, $\alpha,\alpha'$-bis(t-butylperoxy-m-isopropyl)benzene is preferably used. $\alpha,\alpha'$-Bis(t-butylperoxy-m-isopropyl)benzene has a relatively high reaction initiation temperature and thus can suppress the promotion of the curing reaction at the time point at which curing is not required, for example, at the time of prepreg drying, and can suppress a decrease in storage stability of the resin composition. $\alpha,\alpha'$-Bis(t-butylperoxy-m-isopropyl)benzene exhibits low volatility, thus does not volatilize at the time of prepreg drying and storage, and exhibits favorable stability. The reaction initiators may be used singly or in combination of two or more thereof.

As described above, the resin composition according to the present embodiment may contain a curing accelerator. The curing accelerator is not particularly limited as long as it can promote the curing reaction of the resin composition. Specific examples of the curing accelerator include imidazoles and derivatives thereof, organophosphorus compounds, amines such as secondary amines and tertiary amines, quaternary ammonium salts, organoboron compounds, and metal soaps. Examples of the imidazoles include 2-ethyl-4-methylimidazole, 2-methylimidazole, 2-phenyl-4-methylimidazole, 2-phenylimidazole, and 1-benzyl-2-methylimidazole. Examples of the organophosphorus compounds include triphenylphosphine, diphenylphosphine, phenylphosphine, tributylphosphine, and trimethylphosphine. Examples of the amines include dimethylbenzylamine, triethylenediamine, triethanolamine, and 1,8-diaza-bicyclo(5,4,0)undecene-7 (DBU). Examples of the quaternary ammonium salts include tetrabutylammonium bromide. Examples of the organoboron compounds include tetraphenylboron salts such as 2-ethyl-4-methylimidazole-tetraphenylborate and tetra-substituted phosphonium/tetra-substituted borate such as tetraphenylphosphonium/ethyltriphenylborate. The metal soap refers to a fatty acid metal salt, and may be a linear fatty acid metal salt or a cyclic fatty acid metal salt. Specific examples of the metal soaps include linear aliphatic metal salts and cyclic aliphatic metal salts having 6 to 10 carbon atoms. More specific examples thereof include aliphatic metal salts formed from linear fatty acids such as stearic acid, lauric acid, ricinoleic acid, and octylic acid and cyclic fatty acids such as naphthenic acid and metals such as lithium, magnesium, calcium, barium, copper, and zinc. Examples thereof include zinc octylate. The curing accelerators may be used singly or in combination of two or more kinds thereof.

As described above, the resin composition according to the present embodiment may contain a silane coupling agent. The silane coupling agent may be contained in the resin composition or may be contained as a silane coupling agent covered on the inorganic filler contained in the resin composition for surface treatment in advance. Among these, it is preferable that the silane coupling agent is contained as a silane coupling agent covered on the inorganic filler for surface treatment in advance, and it is more preferable that the silane coupling agent is contained as a silane coupling agent covered on the inorganic filler for surface treatment in advance and further is also contained in the resin composition. In the case of a prepreg, the silane coupling agent may be contained in the prepreg as a silane coupling agent covered on the fibrous base material for surface treatment in advance. Examples of the silane coupling agent include those similar to the silane coupling agents used in the surface treatment of the inorganic filler described above.

As described above, the resin composition according to the present embodiment may contain a flame retardant. The flame retardancy of a cured product of the resin composition can be enhanced by containing a flame retardant. The flame retardant is not particularly limited. Specifically, in the field in which halogen-based flame retardants such as bromine-based flame retardants are used, for example, ethylenedipentabromobenzene, ethylenebistetrabromoimide, decabromodiphenyloxide, and tetradecabromodiphenoxybenzene that have a melting point of 300° C. or more, and a bromostyrene-based compound that reacts with the polymerizable compound are preferable. It is considered that the elimination of halogen at a high temperature and the decrease in heat resistance can be suppressed by the use of a halogen-based flame retardant. There is a case where a flame retardant containing phosphorus (phosphorus-based flame retardant) is used in fields required to be halogen-free. The phosphorus-based flame retardant is not particularly limited, and examples thereof include a phosphate ester-based flame retardant, a phosphazene-based flame retardant, a bis(diphenylphosphine oxide)-based flame retardant, and a phosphinate-based flame retardant. Specific examples of the phosphate ester-based flame retardant include a condensed phosphate ester such as dixylenyl phosphate. Specific examples of the phosphazene-based flame retardant include phenoxyphosphazene. Specific examples of the bis(diphenylphosphine oxide)-based flame retardant include xylylenebis(diphenylphosphine oxide). Specific examples of the phosphinate-based flame retardant include metal phosphinates such as an aluminum dialkyl phosphinate. As the flame retardant, the respective flame retardants exemplified may be used singly or in combination of two or more kinds thereof.

(Use)

The resin composition is used when a prepreg is manufactured, as described later. The resin composition is used when a resin layer included in a metal foil with resin and a film with resin is formed and when an insulating layer included in a metal-clad laminate and a wiring board is formed. As described above, the resin composition affords a cured product exhibiting excellent low dielectric properties such as a low relative dielectric constant. For this reason, the resin composition is suitably used to form an insulating layer included in a wiring board compatible with high frequencies, such as wiring boards for antennas and antenna boards for millimeter-wave radar. In other words, the resin composition is suitable for manufacture of wiring boards compatible with high frequencies.

(Production Method)

The method for producing the resin composition is not particularly limited, and examples thereof include a method in which a preliminary reaction to obtain the preliminary reaction product (A) is conducted and then the obtained preliminary reaction product (A) and the curable resin (B) are mixed together so as to have predetermined contents. Examples thereof include the method to be described later in the case of obtaining a varnish-like composition containing an organic solvent.

By using the resin composition according to the present embodiment, a prepreg, a metal-clad laminate, a wiring board, a metal foil with resin, and a film with resin can be obtained as described below.

[Prepreg]

FIG. 1 is a schematic sectional view illustrating an example of a prepreg 1 according to an embodiment of the present invention.

As illustrated in FIG. 1, the prepreg 1 according to the present embodiment includes the resin composition or a semi-cured product 2 of the resin composition and a fibrous base material 3. This prepreg 1 includes the resin composition or the semi-cured product 2 of the resin composition and the fibrous base material 3 present in the resin composition or the semi-cured product 2 of the resin composition.

In the present embodiment, the semi-cured product is in a state in which the resin composition has been cured to an extent that the resin composition can be further cured. In other words, the semi-cured product is the resin composition in a semi-cured state (B-staged). For example, when a resin composition is heated, the viscosity of the resin composition first gradually decreases, then curing starts, and the viscosity gradually increases. In such a case, the semi-cured state includes a state in which the viscosity has started to increase but curing is not completed, and the like.

The prepreg to be obtained using the resin composition according to the present embodiment may include a semi-cured product of the resin composition as described above or include the uncured resin composition itself. In other words, the prepreg may be a prepreg including a semi-cured product of the resin composition (the resin composition in B stage) and a fibrous base material or a prepreg including the resin composition before being cured (the resin composition in A stage) and a fibrous base material. The resin composition or a semi-cured product of the resin composition may be one obtained by drying or heating and drying the resin composition.

When a prepreg is manufactured, the resin composition 2 is often prepared in a varnish form and used in order to be impregnated into the fibrous base material 3 which is a base material for forming the prepreg. In other words, the resin composition 2 is usually a resin varnish prepared in a varnish form in many cases. Such a varnish-like resin composition (resin varnish) is prepared, for example, as follows.

First, the respective components which can be dissolved in an organic solvent are introduced into and dissolved in an organic solvent. At this time, heating may be performed if necessary. Thereafter, components which are used if necessary but are not dissolved in the organic solvent are added to and dispersed in the solution until a predetermined dispersion state is achieved using a ball mill, a bead mill, a planetary mixer, a roll mill or the like, whereby a varnish-like resin composition is prepared. The organic solvent used here is not particularly limited as long as it dissolves the polyphenylene ether compound, the curing agent, and the like, and does not inhibit the curing reaction. Specific examples thereof include toluene and methyl ethyl ketone (MEK).

Specific examples of the fibrous base material include glass cloth, aramid cloth, polyester cloth, a glass nonwoven fabric, an aramid nonwoven fabric, a polyester nonwoven fabric, pulp paper, and linter paper. When glass cloth is used, a laminate exhibiting excellent mechanical strength is obtained, and glass cloth subjected to flattening is particularly preferable. Specific examples of the flattening include a method in which glass cloth is continuously pressed at an appropriate pressure using a press roll to flatly compress the yarn. The thickness of the generally used fibrous base material is, for example, 0.01 mm or more and 0.3 mm or less. The glass fiber constituting the glass cloth is not particularly limited, and examples thereof include Q glass, NE glass, E glass, S glass, T glass, L glass, and L2 glass. The surface of the fibrous base material may be subjected to a surface treatment with a silane coupling agent. The silane coupling agent is not particularly limited, but examples thereof include a silane coupling agent having at least one selected from the group consisting of a vinyl group, an acryloyl group, a methacryloyl group, a styryl group, an amino group, and an epoxy group in the molecule.

The method for manufacturing the prepreg is not particularly limited as long as the prepreg can be manufactured. Specifically, when the prepreg is manufactured, the resin composition according to the present embodiment described above is often prepared in a varnish form and used as a resin varnish as described above.

Specific examples of the method for manufacturing the prepreg 1 include a method in which the fibrous base material 3 is impregnated with the resin composition 2, for example, the resin composition 2 prepared in a varnish form, and then dried. The fibrous base material 3 is impregnated with the resin composition 2 by dipping, coating, and the like. If necessary, the impregnation can be repeated a plurality of times. Moreover, at this time, it is also possible to finally adjust the composition and impregnated amount to the desired composition and impregnated amount by repeating impregnation using a plurality of resin compositions having different compositions and concentrations.

The fibrous base material 3 impregnated with the resin composition (resin varnish) 2 is heated under desired heating conditions, for example, at 40° C. or more and 180° C. or less for 1 minute or more and 10 minutes or less. By heating, the prepreg 1 before being cured (A-stage) or in a semi-cured state (B-stage) is obtained. By the heating, the organic solvent can be decreased or removed by being volatilized from the resin varnish.

The resin composition according to the present embodiment is a resin composition, which affords a cured product exhibiting excellent low dielectric properties, heat resistance, and desmear properties and a high glass transition temperature. For this reason, the prepreg including this resin composition or a semi-cured product of this resin composition is a prepreg, which affords a cured product exhibiting excellent low dielectric properties, heat resistance, and desmear properties and a high glass transition temperature. Moreover, a wiring board including an insulating layer containing a cured product, which exhibits excellent low dielectric properties, heat resistance, and desmear properties and a high glass transition temperature can be suitably manufactured using this prepreg.

[Metal-Clad Laminate]

Figure 2:
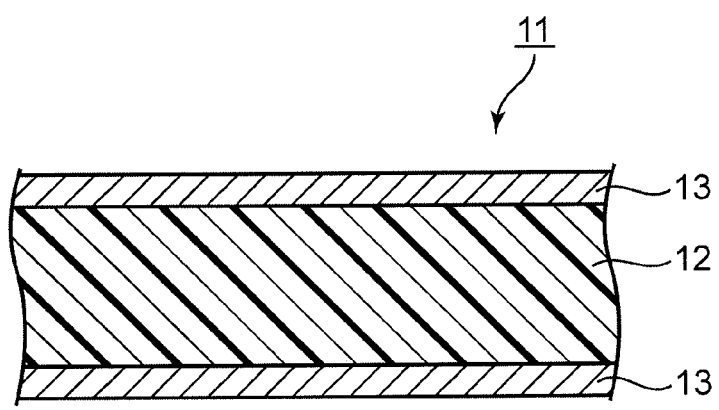
FIG. 2 is a schematic sectional view illustrating an example of a metal-clad laminate according to an embodiment of the present invention.

FIG. 2 is a schematic sectional view illustrating an example of a metal-clad laminate 11 according to an embodiment of the present invention.

As illustrated in FIG. 2, the metal-clad laminate 11 according to the present embodiment includes an insulating layer 12 containing a cured product of the resin composition and a metal foil 13 provided on the insulating layer 12. Examples of the metal-clad laminate 11 include a metal-clad laminate including an insulating layer 12 containing a cured product of the prepreg 1 illustrated in FIG. 1 and a metal foil 13 to be laminated together with the insulating layer 12. The insulating layer 12 may be formed of a cured product of the resin composition or a cured product of the prepreg. In addition, the thickness of the metal foil 13 varies depending on the performance and the like to be required for the finally obtained wiring board and is not particularly limited. The thickness of the metal foil 13 can be appropriately set depending on the desired purpose and is preferably, for example, 0.2 to 70 µm. Examples of the metal foil 13 include a copper foil and an aluminum foil, and the metal foil 13 may be a copper foil with carrier which includes a release layer and a carrier for the improvement in handleability in a case where the metal foil is thin.

The method for manufacturing the metal-clad laminate 11 is not particularly limited as long as the metal-clad laminate 11 can be manufactured. Specific examples thereof include a method in which the metal-clad laminate 11 is fabricated using the prepreg 1. Examples of this method include a method in which the double-sided metal foil-clad or single-sided metal foil-clad laminate 11 is fabricated by stacking one sheet or a plurality of sheets of prepreg 1, further stacking the metal foil 13 such as a copper foil on both or one of upper and lower surfaces of the prepregs 1, and laminating and integrating the metal foils 13 and prepregs 1 by heating and pressing. In other words, the metal-clad laminate 11 is obtained by laminating the metal foil 13 on the prepreg 1 and then performing heating and pressing. The heating and pressing conditions can be appropriately set depending on the thickness of the metal-clad laminate 11, the kind of the resin composition contained in the prepreg 1, and the like. For example, it is possible to set the temperature to 170° C. to 230° C., the pressure to 2 to 4 MPa, and the time to 60 to 150 minutes. Moreover, the metal-clad laminate may be manufactured without using a prepreg. Examples thereof include a method in which a varnish-like resin composition is applied on a metal foil to form a layer containing the resin composition on the metal foil and then heating and pressing is performed.

The resin composition according to the present embodiment is a resin composition, which affords a cured product exhibiting excellent low dielectric properties, heat resistance, and desmear properties and a high glass transition temperature. For this reason, the metal-clad laminate including an insulating layer containing a cured product of this resin composition is a metal-clad laminate including an insulating layer containing a cured product, which exhibits excellent low dielectric properties, heat resistance, and desmear properties and a high glass transition temperature. Moreover, a wiring board including an insulating layer containing a cured product, which exhibits excellent low dielectric properties, heat resistance, and desmear properties and a high glass transition temperature can be suitably manufactured using this metal-clad laminate.

[Wiring Board]

Figure 3:
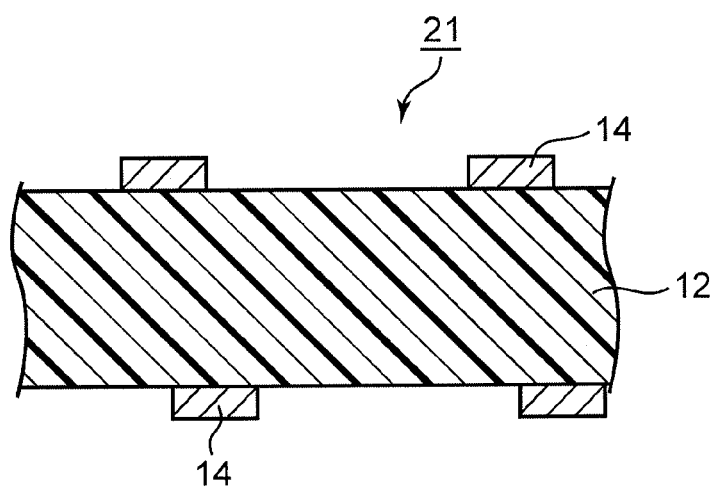
FIG. 3 is a schematic sectional view illustrating an example of a wiring board according to an embodiment of the present invention.

FIG. 3 is a schematic sectional view illustrating an example of a wiring board 21 according to an embodiment of the present invention.

As illustrated in FIG. 3, the wiring board 21 according to the present embodiment includes an insulating layer 12 containing a cured product of the resin composition and wiring 14 provided on the insulating layer 12. Examples of the wiring board 21 include a wiring board formed of an insulating layer 12 obtained by curing the prepreg 1 illustrated in FIG. 1 and wiring 14 which is laminated together with the insulating layer 12 and is formed by partially removing the metal foil 13. The insulating layer 12 may be formed of a cured product of the resin composition or a cured product of the prepreg.

The method for manufacturing the wiring board 21 is not particularly limited as long as the wiring board 21 can be manufactured. Specific examples thereof include a method in which the wiring board 21 is fabricated using the prepreg 1. Examples of this method include a method in which the wiring board 21, in which wiring is provided as a circuit on the surface of the insulating layer 12, is fabricated by forming wiring through etching and the like of the metal foil 13 on the surface of the metal-clad laminate 11 fabricated in the manner described above. In other words, the wiring board 21 is obtained by partially removing the metal foil 13 on the surface of the metal-clad laminate 11 and thus forming a circuit. Examples of the method for forming a circuit include circuit formation by a semi-additive process (SAP) or a modified semi-additive process (MSAP) in addition to the method described above.

The wiring board 21 is a wiring board including an insulating layer 12 containing a cured product, which exhibits excellent low dielectric properties, heat resistance, and desmear properties and a high glass transition temperature.

[Metal Foil with Resin]

Figure 4:
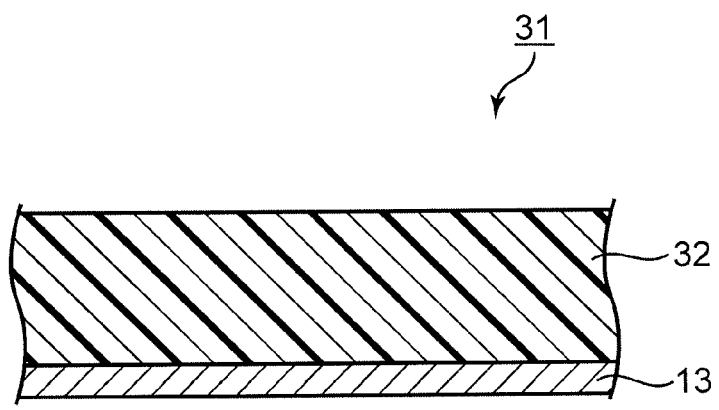
FIG. 4 is a schematic sectional view illustrating an example of a metal foil with resin according to an embodiment of the present invention.

FIG. 4 is a schematic sectional view illustrating an example of a metal foil with resin 31 according to the present embodiment.

The metal foil with resin 31 according to the present embodiment includes a resin layer 32 containing the resin composition or a semi-cured product of the resin composition and a metal foil 13 as illustrated in FIG. 4. The metal foil with resin 31 includes the metal foil 13 on the surface of the resin layer 32. In other words, the metal foil with resin 31 includes the resin layer 32 and the metal foil 13 to be laminated together with the resin layer 32. The metal foil with resin 31 may include other layers between the resin layer 32 and the metal foil 13.

The resin layer 32 may contain a semi-cured product of the resin composition as described above or may contain the uncured resin composition. In other words, the metal foil with resin 31 may be a metal foil with resin including a resin layer containing a semi-cured product of the resin composition (the resin composition in B stage) and a metal foil or a metal foil with resin including a resin layer containing the resin composition before being cured (the resin composition in A stage) and a metal foil. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the metal foil, metal foils used in metal-clad laminates or metal foils with resin can be used without limitation. Examples of the metal foil include a copper foil and an aluminum foil.

The metal foil with resin 31 may include a cover film and the like if necessary. By including a cover film, it is possible to prevent entry of foreign matter and the like. The cover film is not particularly limited, and examples thereof include a polyolefin film, a polyester film, a polymethylpentene film, and films formed by providing a release agent layer on these films.

The method for manufacturing the metal foil with resin 31 is not particularly limited as long as the metal foil with resin 31 can be manufactured. Examples of the method for manufacturing the metal foil with resin 31 include a method in which the varnish-like resin composition (resin varnish) is applied on the metal foil 13 and heated to manufacture the metal foil with resin 31. The varnish-like resin composition is applied on the metal foil 13 using, for example, a bar coater. The applied resin composition is heated under the conditions of, for example, 40° C. or more and 180° C. or less and 0.1 minute or more and 10 minutes or less. The heated resin composition is formed as the uncured resin layer 32 on the metal foil 13. By the heating, the organic solvent can be decreased or removed by being volatilized from the resin varnish.

The resin composition according to the present embodiment is a resin composition, which affords a cured product exhibiting excellent low dielectric properties, heat resistance, and desmear properties and a high glass transition temperature. For this reason, the metal foil with resin including a resin layer containing this resin composition or a semi-cured product of this resin composition is a metal foil with resin including a resin layer, which affords a cured product exhibiting excellent low dielectric properties, heat resistance, and desmear properties and a high glass transition temperature. Moreover, this metal foil with resin can be used when a wiring board is manufactured which includes an insulating layer containing a cured product exhibiting excellent low dielectric properties, heat resistance, and desmear properties and a high glass transition temperature. For example, by laminating the metal foil with resin on a wiring board, a multilayer wiring board can be manufactured. As a wiring board obtained using such a metal foil with resin, there is obtained a wiring board including an insulating layer containing a cured product, which exhibits excellent low dielectric properties, heat resistance, and desmear properties and a high glass transition temperature.

[Film with Resin]

Figure 5:
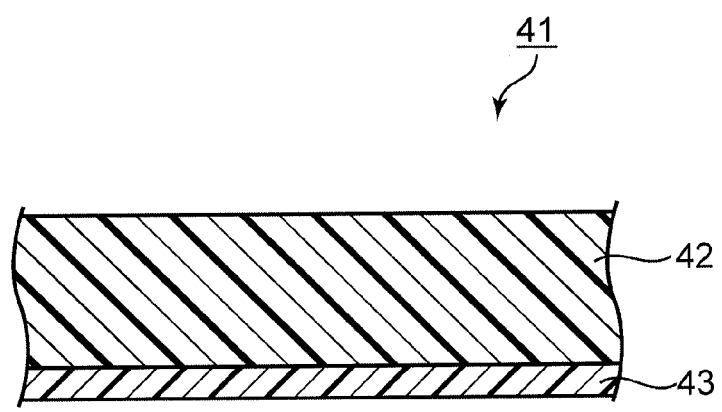
FIG. 5 is a schematic sectional view illustrating an example of a film with resin according to an embodiment of the present invention.

FIG. 5 is a schematic sectional view illustrating an example of a film with resin 41 according to the present embodiment.

The film with resin 41 according to the present embodiment includes a resin layer 42 containing the resin composition or a semi-cured product of the resin composition and a support film 43 as illustrated in FIG. 5. The film with resin 41 includes the resin layer 42 and the support film 43 to be laminated together with the resin layer 42. The film with resin 41 may include other layers between the resin layer 42 and the support film 43.

The resin layer 42 may contain a semi-cured product of the resin composition as described above or may contain the uncured resin composition. In other words, the film with resin 41 may be a film with resin including a resin layer containing a semi-cured product of the resin composition (the resin composition in B stage) and a support film or a film with resin including a resin layer containing the resin composition before being cured (the resin composition in A stage) and a support film. The resin layer is only required to contain the resin composition or a semi-cured product of the resin composition and may or may not contain a fibrous base material. The resin composition or a semi-cured product of the resin composition may be one obtained by drying or heating and drying the resin composition. As the fibrous base material, those similar to the fibrous base materials of the prepreg can be used.

As the support film 43, support films used in films with resin can be used without limitation. Examples of the support film include electrically insulating films such as a polyester film, a polyethylene terephthalate (PET) film, a polyimide film, a polyparabanic acid film, a polyether ether ketone film, a polyphenylene sulfide film, a polyamide film, a polycarbonate film, and a polyarylate film.

The film with resin 41 may include a cover film and the like if necessary. By including a cover film, it is possible to prevent entry of foreign matter and the like. The cover film is not particularly limited, and examples thereof include a polyolefin film, a polyester film, and a polymethylpentene film.

The support film and the cover film may be those subjected to surface treatments such as a matt treatment, a corona treatment, a release treatment, and a roughening treatment if necessary.

The method for manufacturing the film with resin 41 is not particularly limited as long as the film with resin 41 can be manufactured. Examples of the method for manufacturing the film with resin 41 include a method in which the varnish-like resin composition (resin varnish) is applied on the support film 43 and heated to manufacture the film with resin 41. The varnish-like resin composition is applied on the support film 43 using, for example, a bar coater. The applied resin composition is heated under the conditions of, for example, 40° C. or more and 180° C. or less and 0.1 minute or more and 10 minutes or less. The heated resin composition is formed as the uncured resin layer 42 on the support film 43. By the heating, the organic solvent can be decreased or removed by being volatilized from the resin varnish.

The resin composition according to the present embodiment is a resin composition, which affords a cured product exhibiting excellent low dielectric properties, heat resistance, and desmear properties and a high glass transition temperature. For this reason, the film with resin including a resin layer containing this resin composition or a semi-cured product of this resin composition is a film with resin including a resin layer, which affords a cured product exhibiting excellent low dielectric properties, heat resistance, and desmear properties and a high glass transition temperature. Moreover, this film with resin can be used when a wiring board is suitably manufactured which includes an insulating layer containing a cured product exhibiting excellent low dielectric properties, heat resistance, and desmear properties and a high glass transition temperature. A multilayer wiring board can be manufactured, for example, by laminating the film with resin on a wiring board and then peeling off the support film from the film with resin or by peeling off the support film from the film with resin and then laminating the film with resin on a wiring board. As a wiring board obtained using such a film with resin, there is obtained a wiring board including an insulating layer containing a cured product, which exhibits excellent low dielectric properties, heat resistance, and desmear properties and a high glass transition temperature.

According to the present invention, it is possible to provide a resin composition, which affords a cured product exhibiting excellent low dielectric properties, heat resistance, and desmear properties and a high glass transition temperature. According to the present invention, it is possible to provide a prepreg, a film with resin, a metal foil with resin, a metal-clad laminate, and a wiring board, which are obtained using the resin composition.

Hereinafter, the present invention will be described more specifically with reference to examples, but the scope of the present invention is not limited thereto.

EXAMPLES

[Preliminary Reaction Product (A): Preliminary Reaction Products A1 to A14]

First, a preliminary reaction product (A) used in each of Examples and Comparative Examples was prepared.

The respective components used in the production of preliminary reaction product (A) will be described.

(Polyphenylene Ether Compound (a1))

PPE: Polyphenylene ether compound having hydroxyl group in molecule (SA90 manufactured by SABIC Innovative Plastics Co., Ltd., number of terminal hydroxyl groups: 2, number average molecular weight Mn: 1700, phenol equivalent (hydroxyl group equivalent): 850 g/eq)

(Acid Anhydride (a2))

Acid anhydride 1: Mixture of 4-methylhexahydrophthalic anhydride and hexahydrophthalic anhydride (mass ratio 70:30) (RIKACID MH-700 manufactured by New Japan Chemical Co., Ltd., monofunctional acid anhydride, liquid alicyclic acid anhydride, functional group equivalent of acid anhydride group: 161 to 166 g/eq, freezing point: 20° C.)

Acid anhydride 2: Octenyl succinic anhydride (RIKACID OSA manufactured by New Japan Chemical Co., Ltd., monofunctional acid anhydride, liquid alicyclic acid anhydride, functional group equivalent of acid anhydride group: 205 to 220 g/eq, freezing point: 15° C. or less)

(Preparation Method)

First, the polyphenylene ether compound (a1) and the acid anhydride (a2) were blended at the composition (parts by mass) presented in Table 1, and this was diluted with toluene so that the solid concentration was 40% by mass. This was stirred and mixed using a disperser. By doing so, the polyphenylene ether compound (a1) and the acid anhydride (a2) were reacted to obtain a preliminary reaction product. As the reaction conditions of the polyphenylene ether compound (a1) and the acid anhydride (a2), the temperature (reaction temperature) and the stirring and mixing time (reaction time) during the stirring and mixing by a disperser were adjusted so that the ring opening rate determined by the calculation method was as high as possible (at least 80% or more). Specifically, when the preliminary reaction products A1 and A9 were prepared, the reaction temperature was set to 80° C. and the reaction time was set to 10 hours. When the preliminary reaction products A2, A3, A5 to A8, A10, and A11 were prepared, the reaction temperature was set to 80° C. and the reaction time was set to 5 hours. When the preliminary reaction product A4 was prepared, the reaction temperature was set to 80° C. and the reaction time was set to 3 hours. When the preliminary reaction products A12, A13, and A14 were prepared, the reaction temperature was set to 20° C. and the reaction time was set to 6 hours. Table 1 presents the ring opening rates in the preliminary reaction products A1 to A14.

The equivalent ratios presented in Table 1 are determined based on the reacting functional group (reactive group). In other words, the equivalent ratio presented in Table 1 is determined as the ratio of values acquired by dividing each blended amount by each functional group equivalent. The equivalent ratio is not calculated as an integer ratio or the like, but is a ratio determined by approximating the value appropriately by rounding off or the like. In other words, the equivalent ratio presented in Table 1 is a ratio determined by approximating the ratio of values acquired by dividing each blended amount by each functional group equivalent by rounding off.

Specifically, the preliminary reaction product A1 will be described. The phenol equivalent (hydroxyl group equivalent) in the polyphenylene ether compound (a1) is 850 g/eq, and the functional group equivalent of the acid anhydride group in the acid anhydride (a2) is 161 to 166 g/eq. Here, calculation is performed assuming that the functional group equivalent of the acid anhydride group in the acid anhydride (a2) is 163 g/eq. The amount of polyphenylene ether compound (a1) blended is 23.3 parts by mass, and the amount of the acid anhydride (a2) blended is 6.7 parts by mass. From these facts, the equivalent ratio (hydroxyl group equivalent in polyphenylene ether compound (a1): acid anhydride group equivalent in acid anhydride (a2)) is calculated as (23.3/850): (6.7/163)=about 1:1.5. The equivalent ratio in the preliminary reaction product A1 is thus 1:1.5. In other words, the equivalent ratio of the acid anhydride groups in the acid anhydride (a2) to the hydroxyl groups in the polyphenylene ether compound (a1) is 1.5.

TABLE 1

| | | | A1 | A2 | A3 | A4 | A5 | A6 | A7 | A8 | A9 | A10 | A11 | A12 | A13 | A14 |
|---|---|---|---|---|---|---|---|---|---|---|---|---|---|---|---|---|
| Composition (parts by mass) | Polyphenylene ether compound (a1) | PPE | 23.3 | 25.1 | 27.3 | 28.4 | 23.9 | 67.0 | 41.9 | 16.8 | 21.6 | 75.3 | 8.4 | 25.1 | 16.8 | 12.6 |
| | Acid anhydride (a2) | Acid anhydride 1 | 6.7 | 4.9 | 2.7 | 1.6 | — | 13.0 | 8.1 | 3.2 | 8.4 | 14.7 | 1.6 | 4.9 | 3.2 | 1.2 |
| | | Acid anhydride 2 | — | — | — | — | 6.1 | — | — | — | — | — | — | — | — | — |
| Equivalent ratio (hydroxyl group in a1:acid anhydride group in a2) | | | 1:1.5 | 1:1 | 1:0.5 | 1:0.3 | 1:1 | 1:1 | 1:1 | 1:1 | 1:2 | 1:1 | 1:1 | 1:1 | 1:1 | 1:1 |
| Ring opening rate (%) | | | 83 | 90 | 93 | 95 | 90 | 90 | 90 | 90 | 72 | 90 | 90 | 88 | 88 | 88 |

Examples 1 to 19 and Comparative Examples 1 to 7

The respective components used when a prepreg is fabricated in the present Examples will be described.

(Preliminary Reaction Product (A))

As the preliminary reaction product (A), the preliminary reaction products A1 to A14 described above were used. The composition (parts by mass) of the preliminary reaction product (A) in Tables 2 and 3 indicates the mass of solid components.

(PPE)

PPE: PPE the same as PPE used in the preparation of preliminary reaction product was used. Specifically, a polyphenylene ether compound having a hydroxyl group in the molecule (SA90 manufactured by SABIC Innovative Plastics Co., Ltd., number of terminal hydroxyl groups: 2, number average molecular weight Mn: 1700, phenol equivalent (hydroxyl group equivalent): 850 g/eq) was used. Meanwhile, examples using this PPE (examples in which the composition of PPE is described in Table 2: Comparative Examples 2 and 3) are Examples in which the preliminary reaction is not conducted.

(Acid Anhydride)

Acid anhydride 1: An acid anhydride the same as the acid anhydride 1 used in the preparation of preliminary reaction product was used. Specifically, a mixture of 4-methylhexahydrophthalic anhydride and hexahydrophthalic anhydride (mass ratio 70:30) (RIKACID MH-700 manufactured by New Japan Chemical Co., Ltd., monofunctional acid anhydride, liquid alicyclic acid anhydride, functional group equivalent of acid anhydride group: 161 to 166 g/eq, freezing point: 20° C.) was used. Meanwhile, in examples using this acid anhydride 1 (examples in which the composition of acid anhydride 1 is described in Table 2: Comparative Example 3), the preliminary reaction is not conducted.

In Comparative Examples 6 and 7 as well, the preliminary reaction is not conducted.

(Curable Resin (B))

(Reactive Compound: Maleimide Compound)

Maleimide compound 1: Biphenylaralkyl-type bismaleimide compound (MIR-3000-70MT manufactured by Nippon Kayaku Co., Ltd., bismaleimide compound, functional group equivalent of maleimide group: 275 g/eq)

Maleimide compound 2: 3,3'-Dimethyl-5,5'-diethyl-4,4'-diphenylmethane bismaleimide (BMI-5100 manufactured by Nippon Kayaku Co., Ltd., bismaleimide compound, functional group equivalent of maleimide group: 221 g/eq)

(Reactive Compound: Reactive Compound Other than Maleimide Compound)

Modified PPE 1: Polyphenylene ether compound having vinylbenzyl group (ethenylbenzyl group) at molecular terminal (styrene-modified polyphenylene ether) (OPE-1200 manufactured by Mitsubishi Gas Chemical Company, Inc., number average molecular weight Mn: 1200, functional group equivalent of vinylbenzyl group: 670 g/eq)

Modified PPE 2: Polyphenylene ether compound with methacryloyl group at the molecular terminal (methacryl-modified polyphenylene ether) (SA9000 manufactured by Saudi Basic Industries Corporation. weight average molecular weight Mw: 1700, functional group equivalent of methacryloyl group: 850 g/eq)

(Benzoxazine Compound)

Benzoxazine Compound 1: 3,3'-(Methylene-1,4-diphenylene)bis(3,4-dihydro-2H-1,3-benzoxazine) (P-d type benzoxazine compound manufactured by SHIKOKU CHEMICALS CORPORATION, functional group equivalent of benzoxazine group: 217 g/eq)

Benzoxazine compound 2: 2,2-Bis(3,4-dihydro-2H-3-phenyl-1,3-benzoxazine)methane (F-a type benzoxazine compound manufactured by SHIKOKU CHEMICALS CORPORATION, functional group equivalent of benzoxazine group: 210 g/eq)

(Curing Accelerator)

2E4MZ: Imidazole-based curing accelerator (2-ethyl-4-methylimidazole, 2E4MZ manufactured by SHIKOKU CHEMICALS CORPORATION)

(Inorganic Filler)

Inorganic filler 1: Spherical silica subjected to surface treatment with vinylsilane (SC2300-SVJ manufactured by ADMATECHS COMPANY LIMITED)

Inorganic filler 2: Spherical silica subjected to surface treatment with phenylaminosilane (SC2500-SXJ manufactured by ADMATECHS COMPANY LIMITED)

(Preparation Method)

First, the components other than the inorganic filler were added to methyl ethyl ketone (MEK) at the compositions (parts by mass) presented in Tables 2 and 3 so that the solid concentration was 60% by mass, and the mixture was stirred and mixed using a disperser for homogenization. The inorganic filler was added to the homogenized mixture at the compositions (parts by mass) presented in Tables 2 and 3, and the mixture was stirred and mixed using a disperser for 2 hours for homogenization. By doing so, a varnish-like resin composition (varnish) was obtained.

Next, a prepreg and an evaluation substrate 1 (metal-clad laminate) were obtained as follows.

The obtained varnish was impregnated into a fibrous base material (glass cloth: "2116 type cloth" manufactured by Nitto Boseki Co., Ltd.) and then heated and dried at 150° C. using a non-contact type heating unit. By doing so, the solvent in the varnish was removed and the resin composition was semi-cured to obtain a prepreg (340 mm×510 mm). At that time, the content (resin content) of the components constituting the resin composition with respect to the prepreg was adjusted to be 47% by mass by the curing reaction.

Next, an evaluation substrate 1 (metal-clad laminate) was obtained as follows.

Six sheets of each of the obtained prepregs were stacked, and copper foil (manufactured by Mitsui Mining & Smelting Co., Ltd., thickness: 35 μm, ST foil, one roughened surface) was disposed on both sides of the stacked body so that the roughened surface was on the prepreg side. This as a body to be pressed was heated and pressed under the conditions of 200° C., 90 minutes, and a pressure of 2.94 MPa, thereby obtaining a copper-clad laminate (evaluation substrate 1: metal-clad laminate) having a copper foil bonded to both surfaces and a thickness of about 0.6 mm.

A copper-clad laminate (evaluation substrate 2: metal-clad laminate) having a copper foil bonded to both surfaces and a thickness of about 0.8 mm was obtained in the same manner as the evaluation substrate 1 except that the number of sheets of prepreg used was changed to 8.

A copper-clad laminate (evaluation substrate 3: metal-clad laminate) having a copper foil bonded to both surfaces and a thickness of about 0.1 mm was obtained in the same manner as the evaluation substrate 1 except that the number of sheets of prepreg used was changed to 1.

The evaluation substrates 1 to 3 (copper-clad laminates) fabricated as described above were evaluated by the following methods.

[Desmear Properties]

First, the copper foil on the surface of the evaluation substrate 1 (copper-clad laminate) was removed by etching. As a desmear process, the substrate from which the copper foil was removed was immersed in a swelling liquid (Swelling Dip Securiganth P manufactured by Atotech) at 60° C. for 5 minutes, then immersed in an aqueous potassium permanganate solution (Concentrate Compact CP manufactured by Atotech) at 80° C. for 10 minutes, and then subjected to neutralization. Before and after such a desmear process, the weight of the substrate was measured, and the amount of weight decrease (weight of substrate before desmear process—weight of substrate after desmear process) due to the desmear process was calculated, and the amount of weight decrease per 1 $mm^2$ ($mg/mm^2$) was calculated from the amount of weight decrease. Based on the amount of weight decrease per 1 $mm^2$, evaluation was performed as follows.

It was evaluated as "A (x)" when the amount of weight decrease per 1 $mm^2$ was less than 15 $mg/mm^2$, it was evaluated as "B (◯)" when the amount of weight decrease per 1 $mm^2$ was 15 $mg/mm^2$ or more and less than 30 $mg/mm^2$, it was evaluated as "C (◉)" when the amount of weight decrease per 1 $mm^2$ was 30 $mg/mm^2$ or more and less than 45 $mg/mm^2$, and it was evaluated as "D (x)" when the amount of weight decrease per 1 $mm^2$ was 45 $mg/mm^2$ or more.

The "A (x)" is not preferable since it is difficult to remove smear, and the "D (x)" is not preferable since the resin is excessively removed and the shape of the vias and the like cannot be maintained. On the other hand, "B (◯)" and "C (◉)" are preferable since smear can be removed while the shape of vias and the like can be maintained, and "C (◉)" is more preferable from this point.

[Relative Dielectric Constant Dk]

The relative dielectric constant (Dk) at 1 GHz was measured by the cavity perturbation method using an unclad substrate obtained by removing the copper foil from the evaluation substrate 2 (copper-clad laminate) by etching as a test piece. Specifically, the relative dielectric constant (Dk) of the unclad substrate (insulating layer included in the evaluation substrate 2) was measured at 1 GHz in conformity with IPC-TM-650 2.5.5.9 using "Impedance/Material Analyzer 4291A" manufactured by Hewlett-Packard Company. A relative dielectric constant of 3.4 or less is favorable.

[Glass Transition Temperature Tg]

Using an unclad substrate obtained by removing the copper foil from the evaluation substrate 2 (copper-clad laminate) by etching as a test piece, the glass transition temperature (Tg) of the unclad substrate (the insulating layer included in the evaluation substrate 2) was measured using a viscoelastic spectrometer "DMS6100" manufactured by Seiko Instruments Inc. At this time, dynamic viscoelasticity measurement (DMA) was performed with a tensile module at a frequency of 10 Hz, and the temperature at which tan δ was maximized when the temperature was raised from room temperature to 280° C. at a rate of temperature rise of 5° C./min was taken as the glass transition temperature Tg (° C.). A glass transition temperature of 200° C. or more is favorable.

[Heat Resistance (Oven Heat Resistance)]

The evaluation substrate 3 was left in a dryer set to 260° C. for 1 hour and in a dryer set to 280° C. for 1 hour. Thereafter, the presence or absence of blistering in the laminate after being left was visually observed. It was evaluated as "A (x)" when blistering was confirmed after being left in a dryer at 260° C. It was evaluated as "B (◯)" when blistering was confirmed after being left in a dryer at 280° C. but blistering was not confirmed after being left in a dryer at 260° C. It was evaluated as "C (◉)" when blistering was not confirmed after being left in a dryer at 280° C. "B (◯)" and "C (◉)" are determined to be favorable in terms of oven heat resistance, and "C (◉)" is more preferable.

The results of the respective evaluations are presented in Tables 2 and 3.

TABLE 2

| | | Example | | | | | | | |
|---|---|---|---|---|---|---|---|---|---|
| | | 1 | 2 | 3 | 4 | 5 | 6 | 7 | 8 |
| Composition (parts by mass) | Preliminary reaction product (A) | A1 | A2 | A3 | A4 | A5 | A6 | A7 | A8 |
| | | 30 | 30 | 30 | 30 | 30 | 80 | 50 | 20 |
| | PPE | — | — | — | — | — | — | — | — |
| | Acid anhydride 1 | — | — | — | — | — | — | — | — |
| Curable resin (B) | Maleimide compound 1 | 50 | 50 | 50 | 50 | 50 | 10 | 30 | 60 |
| | Modified PPE 1 | 20 | 20 | 20 | 20 | 20 | 10 | 20 | 20 |
| Curing accelerator | 2E4MZ | 0.3 | 0.3 | 0.3 | 0.3 | 0.3 | 0.3 | 0.3 | 0.3 |
| | Inorganic filler 1 | 100 | 100 | 100 | 100 | 100 | 100 | 100 | 100 |
| Evaluation | Desmear properties | C (⊙) | C (⊙) | B (○) | B (○) | B (○) | C (⊙) | C (⊙) | B (○) |
| | Relative dielectric constant Dk | 3.4 | 3.4 | 3.4 | 3.4 | 3.4 | 3.1 | 3.2 | 3.4 |
| | Glass transition temperature Tg (° C.) | 238 | 237 | 237 | 235 | 230 | 210 | 219 | 241 |
| | Heat resistance | B (○) | C (⊙) | C (⊙) | C (⊙) | C (⊙) | B (○) | B (○) | C (⊙) |

| | | Comparative Example | | | | | | |
|---|---|---|---|---|---|---|---|---|
| | | 1 | 2 | 3 | 4 | 5 | 6 | 7 |
| Composition (parts by mass) | Preliminary reaction product (A) | A9 | — | — | A10 | A11 | — | — |
| | | 30 | | | 90 | 10 | | |
| | PPE | — | 30 | 25.1 | — | — | — | — |
| | Acid anhydride 1 | — | — | 4.9 | — | — | — | — |
| Curable resin (B) | Maleimide compound 1 | 50 | 50 | 50 | 10 | 70 | 80 | 20 |
| | Modified PPE 1 | 20 | 20 | 20 | — | 20 | 20 | 80 |
| Curing accelerator | 2E4MZ | 0.3 | 0.3 | 0.3 | 0.3 | 0.3 | 0.3 | 0.3 |
| | Inorganic filler 1 | 100 | 100 | 100 | 100 | 100 | 100 | 100 |
| Evaluation | Desmear properties | C (⊙) | D (X) | C (⊙) | D (X) | A (X) | A (X) | A (X) |
| | Relative dielectric constant Dk | 3.4 | 3.4 | 3.4 | 3.2 | 3.5 | 3.6 | 3 |
| | Glass transition temperature Tg (° C.) | 233 | 185 | 188 | 221 | 241 | 243 | 234 |
| | Heat resistance | A (X) | C (⊙) | A (X) | B (○) | B (○) | C (⊙) | C (⊙) |

TABLE 3

| | | Example | | | | | | | | | | |
|---|---|---|---|---|---|---|---|---|---|---|---|---|
| | | 9 | 10 | 11 | 12 | 13 | 14 | 15 | 16 | 17 | 18 | 19 |
| Composition (parts by mass) | Preliminary reaction product (A) | A2 | A2 | A2 | A2 | A2 | A2 | A2 | A12 | A13 | A14 | A14 |
| | | 30 | 30 | 30 | 30 | 30 | 30 | 30 | 30 | 20 | 15 | 15 |
| Curable resin (B) | Maleimide compound 1 | 60 | 10 | — | 55 | 30 | 55 | 50 | 55 | 60 | 55 | 50 |
| | Maleimide compound 2 | — | — | 50 | — | — | — | — | — | — | — | — |
| | Modified PPE 1 | 10 | 20 | 20 | — | — | — | 20 | — | 20 | 30 | 30 |
| | Modified PPE 2 | — | 40 | — | — | — | — | — | — | — | — | — |
| | Benzoxazine compound 1 | — | — | — | 15 | 30 | — | — | — | — | — | — |
| | Benzoxazine compound 2 | — | — | — | — | — | 15 | — | 15 | — | — | 5 |
| Curing accelerator | 2E4MZ | 0.3 | 0.3 | 0.3 | 0.3 | 0.3 | 0.3 | 0.3 | 0.3 | 0.3 | 0.3 | 0.3 |
| | Inorganic filler 1 | 100 | 100 | 100 | 100 | 100 | 100 | — | 100 | 100 | 100 | — |
| | Inorganic filler 2 | — | — | — | — | — | — | 100 | — | — | — | 100 |
| Evaluation | Desmear properties | C (⊙) | B (○) | C (⊙) | C (⊙) | C (⊙) | C (⊙) | C (⊙) | C (⊙) | B (○) | B (○) | C (⊙) |
| | Relative dielectric constant Dk | 3.4 | 3.2 | 3.4 | 3.4 | 3.4 | 3.4 | 3.4 | 3.4 | 3.4 | 3.4 | 3.4 |
| | Glass transition temperature Tg (° C.) | 239 | 217 | 22.5 | 262 | 267 | 254 | 238 | 237 | 239 | 245 | 252 |
| | Heat resistance | C (⊙) | C (⊙) | C (⊙) | C (⊙) | C (⊙) | C (⊙) | C (⊙) | C (⊙) | C (⊙) | C (⊙) | C (⊙) |

From Tables 2 and 3, in the cases (Examples 1-19) of resin compositions, which contain a preliminary reaction product (A) obtained by previously reacting the polyphenylene ether compound (a1) and the acid anhydride (a2) so that the equivalent ratio (the equivalent ratio of the acid anhydride group in the acid anhydride (a2) to the hydroxyl group in the polyphenylene ether compound (a1)) is 1.5 or less, and the curable resin (B) and in which the content of the curable resin (B) is 20 to 85 parts by mass with respect to 100 parts by mass of the sum (total mass) of the preliminary reaction product (A) and the curable resin (B), it can be seen that cured products, which exhibit excellent low dielectric properties, heat resistance, and desmear properties and a high glass transition temperature, are obtained.

On the other hand, in a case (Comparative Example 1) where a preliminary reaction product obtained by previously conducting a reaction so that the equivalent ratio is 2 (more than 1.5) is contained, it can be seen that the obtained cured product exhibits low heat resistance. From this fact, it can be seen that it is required to contain the preliminary reaction product (A) obtained by previously conducting the reaction so that the equivalent ratio of the acid anhydride group in the acid anhydride (a2) to the hydroxyl group in the polyphenylene ether compound (a1) is 1.5 or less.

In cases (Comparative Examples 2 and 3) where the PPE that has not been subjected to the preliminary reaction is contained but the preliminary reaction product (A) is not contained, it can be seen that the glass transition temperature is low and the desmear properties are inferior (Comparative Example 2) or the heat resistance is inferior (Comparative Example 3). In Comparative Example 2, it can be seen that the resin is too much scraped off by desmear since a preliminary reaction product is not contained as well as an acid anhydride is not contained. In Comparative Example 3, a preliminary reaction product is not contained but PPE and an acid anhydride, which have not been subjected to the preliminary reaction, are contained, and as a result, the heat resistance is inferior. In cases (Comparative Examples 6 and 7) where the preliminary reaction product (A) is not contained as well as PPE and an acid anhydride, which have not been subjected to the preliminary reaction, are not contained, it is difficult to perform desmear. From these facts as well, it can be seen that it is required to contain the preliminary reaction product (A) obtained by previously conducting the reaction so that the equivalent ratio is 1.5 or less.

In a case (Comparative Example 4) where the preliminary reaction product (A) is contained but the content of the curable resin (B) is 10 parts by mass, which is less than 20 parts by mass, with respect to 100 parts by mass of the total mass, it can be seen that the resin is too much scraped off by desmear. In a case (Comparative Example 5) where the preliminary reaction product (A) is contained but the content of the curable resin (B) is 90 parts by mass, which is more than 85 parts by mass, with respect to 100 parts by mass of the total mass, it is difficult to perform desmear. The relative dielectric constant Dk is also high. These are considered to be due to the fact that the content of the preliminary reaction product (A) is small and so the content of the structure derived from the PPE (a1) and the content of the structure derived from the acid anhydride (a2) are also small. From the comparison of Comparative Examples 4 and 5 with Examples 1 to 19 (particularly, Examples 2, 6 to 8, and Examples 16 to 19), it can be seen that the content of the curable resin (B) is required to be 20 to 85 parts by mass with respect to 100 parts by mass of the total mass.

From Examples 1 to 4, it can be seen that the equivalent ratio is only required to be 1.5 or less and is preferably 0.3 to 1.5. From the comparison of Example 2 and the like with Example 5, it can be seen that the acid anhydride used in the preparation of the preliminary reaction product (A) does not have to be a specific acid anhydride and various acid anhydrides may be used. It can be seen from Example 2 and Examples 9 to 19 that the curable resin (B) may have various compositions. From the comparison of Example 2 and the like with Example 15, it can be seen that the inorganic filler does not have to be a specific inorganic filler and various inorganic fillers may be used.

This application is based on Japanese Patent Application No. 2021-055868 filed on Mar. 29, 2021, the contents of which are included in the present application.

In order to express the present invention, the present invention has been described above appropriately and sufficiently through the embodiments. However, it should be recognized by those skilled in the art that changes and/or improvements of the above-described embodiments can be readily made. Accordingly, changes or improvements made by those skilled in the art shall be construed as being included in the scope of the claims unless otherwise the changes or improvements are at the level which departs from the scope of the appended claims.

INDUSTRIAL APPLICABILITY

According to the present invention, there is provided a resin composition, which affords a cured product exhibiting excellent low dielectric properties, heat resistance, and desmear properties and a high glass transition temperature. In addition, according to the present invention, a prepreg, a film with resin, a metal foil with resin, a metal-clad laminate, and a wiring board which are obtained using the resin composition are provided.

The invention claimed is:

1. A resin composition comprising:
    a preliminary reaction product (A) obtained by previously reacting a polyphenylene ether compound (a1) having a hydroxyl group in a molecule and an acid anhydride (a2) having an acid anhydride group in a molecule; and
    a curable resin (B) containing a reactive compound having an unsaturated double bond in a molecule,
    wherein
    the curable resin (B) contains a maleimide compound (B1) and a reactive compound (B2) other than the maleimide compound (B1),
    the reactive compound (B2) includes at least one selected from the group consisting of an unsaturated double bond-modified polyphenylene ether compound having a terminal modified with a substituent having an unsaturated double bond, an allyl compound, an acrylate compound, a methacrylate compound, a polybutadiene compound, and a styrene compound,
    the number of carbon atoms in the acid anhydride (a2) is 6 or more and 25 or less,
    an equivalent ratio of the acid anhydride group in the acid anhydride (a2) to the hydroxyl group in the polyphenylene ether compound (a1) is 1.5 or less, and
    a content of the curable resin (B) is 20 to 85 parts by mass with respect to 100 parts by mass of a sum of the preliminary reaction product (A) and the curable resin (B).

2. The resin composition according to claim 1, wherein the acid anhydride (a2) includes an acid anhydride having one or more cyclic acid anhydride groups in a molecule.

3. The resin composition according to claim 1, wherein the preliminary reaction product (A) includes an ester/carboxyl-modified polyphenylene ether compound having a terminal modified with a substituent having one or more ester bonds and carboxyl groups.

4. The resin composition according to claim 1, wherein
    a content of the maleimide compound (B1) is 10 to 70 parts by mass with respect to 100 parts by mass of a sum of the preliminary reaction product (A) and the curable resin (B), and a content of the reactive compound (B2) is 10 to 70 parts by mass with respect to 100 parts by mass of a sum of the preliminary reaction product (A) and the curable resin (B).

5. The resin composition according to claim 1, wherein the curable resin (B) further contains a benzoxazine compound.

6. The resin composition according to claim 1, further comprising an inorganic filler.

7. The resin composition according to claim 6, wherein the inorganic filler is subjected to surface treatment with a silane coupling agent.

8. A prepreg comprising:
the resin composition according to claim 1 or a semi-cured product of the resin composition; and
a fibrous base material.

9. A film with resin comprising:
a resin layer containing the resin composition according to claim 1 or a semi-cured product of the resin composition; and
a support film.

10. A metal foil with resin comprising:
a resin layer containing the resin composition according to claim 1 or a semi-cured product of the resin composition; and
a metal foil.

11. A metal-clad laminate comprising:
an insulating layer containing a cured product of the resin composition according to claim 1; and
a metal foil.

12. A wiring board comprising:
an insulating layer containing a cured product of the resin composition according to claim 1; and
wiring.

13. A metal-clad laminate comprising:
an insulating layer containing a cured product of the prepreg according to claim 8; and
a metal foil.

14. A wiring board comprising:
an insulating layer containing a cured product of the prepreg according to claim 8; and
wiring.

* * * * *